US012641938B2

(12) United States Patent
Park et al.

(10) Patent No.: US 12,641,938 B2
(45) Date of Patent: May 26, 2026

(54) DISPLAY DEVICE AND MANUFACTURING METHOD THEREOF

(71) Applicant: Samsung Display Co., Ltd., Yongin-Si (KR)

(72) Inventors: Joon Seok Park, Yongin-si (KR); So Young Koo, Yongin-si (KR); Hyung Jun Kim, Yongin-si (KR); Geun Chul Park, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 335 days.

(21) Appl. No.: 18/241,999

(22) Filed: Sep. 5, 2023

(65) Prior Publication Data

US 2024/0145655 A1 May 2, 2024

(30) Foreign Application Priority Data

Oct. 26, 2022 (KR) ........................ 10-2022-0139606

(51) Int. Cl.
  H10H 20/857 (2025.01)
  H10D 86/40 (2025.01)
   (Continued)

(52) U.S. Cl.
  CPC ........ H10H 20/857 (2025.01); H10D 86/481 (2025.01); H10D 86/60 (2025.01);
   (Continued)

(58) Field of Classification Search
  CPC . H01L 25/0753; H01L 25/167; H10D 86/481; H10D 86/60; H10D 86/021;
   (Continued)

(56) References Cited

U.S. PATENT DOCUMENTS

| | | | | |
|---|---|---|---|---|
| 6,624,018 B1* | 9/2003 | Yu | ......................... | H10D 1/714 438/243 |
| 7,666,737 B2* | 2/2010 | Tu | ......................... | H10D 1/714 438/254 |

(Continued)

FOREIGN PATENT DOCUMENTS

| | | |
|---|---|---|
| CN | 112466910 A | 3/2021 |
| KR | 10-2000-0045458 A | 7/2000 |

OTHER PUBLICATIONS

Rongsheng Chen ,Wei Zhou, Meng Zhang, Man Wong, Hoi Sing Kwok, Self-aligned top-gate InGaZnO thin film transistors using SiO2/Al2O3 stack gate dielectric, Elsevier Thin Solid Films 548 (2013) 572-575.

*Primary Examiner* — Victor A Mandala
(74) *Attorney, Agent, or Firm* — Innovation Counsel LLP

(57) ABSTRACT

A display device is disclosed that includes: a substrate; a first conductive layer disposed on the substrate; a first insulating layer positioned on the first conductive layer and having an undercut structure forming an opening; a first capacitor electrode including a portion formed in the undercut structure; a second capacitor electrode including a portion formed in the undercut structure and overlapping the second capacitor electrode to form a capacitor; and a second insulating layer including a portion formed in the undercut structure and positioned between the first capacitor electrode and the second capacitor electrode to function as a dielectric of the capacitor.

15 Claims, 22 Drawing Sheets

(51) Int. Cl.
  *H10D 86/60*       (2025.01)
  *H10W 90/00*       (2026.01)
  *H10H 20/01*       (2025.01)

(52) U.S. Cl.
  CPC .......... *H10W 90/00* (2026.01); *H10H 20/032*
  (2025.01); *H10H 20/0364* (2025.01)

(58) Field of Classification Search
  CPC ............. H10H 20/032; H10H 20/0364; H10H
  20/857; H10K 59/1201; H10K 59/1216;
  H10K 59/131; H10K 59/1213; H10K
  59/123; H10K 71/00
  See application file for complete search history.

(56)                References Cited

U.S. PATENT DOCUMENTS

|  |  |  |  |  |
|---|---|---|---|---|
| 9,842,839 | B1 | 12/2017 | Sills et al. | |
| 2017/0343873 | A1 | 11/2017 | Ma | |
| 2018/0203314 | A1 | 7/2018 | Sugimoto | |
| 2022/0254714 | A1* | 8/2022 | Lu ........................... | H10D 1/042 |
| 2022/0285480 | A1* | 9/2022 | Kalnitsky .............. | H10D 1/042 |
| 2023/0019688 | A1* | 1/2023 | Kao ........................ | H10D 1/714 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2022-0139606, filed in the Korean Intellectual Property Office on Oct. 26, 2022, the entire contents of which are incorporated herein by reference.

BACKGROUND

(a) Technical Field

The present disclosure relates to a display device and a manufacturing method thereof.

(b) Description of the Related Art

A display device such as a liquid crystal display (LCD) or an organic light emitting diode (OLED) display includes a display panel including a plurality of pixels capable of displaying an image. Each pixel includes a pixel electrode for receiving a data signal, and the pixel electrode is connected to at least one transistor to receive the data signal.

In order to manufacture a display device, various electric elements and conductors such as transistors and capacitors may be formed by stacking layers of various materials on a substrate and patterning the layers by a method such as a photolithography process including exposure using a photomask.

The above information disclosed in this Background section is only for enhancement of understanding of the background of the invention, and therefore, it may contain information that does not form the prior art that is already known in this country to a person of ordinary skill in the art.

SUMMARY

A capacitor included in a pixel of a display device needs to maintain a predetermined capacitance, and in particular, it may be difficult to secure a capacitor with sufficient capacity for a display device with a higher resolution.

The present disclosure has been made in an effort to secure sufficient capacitor capacity without increasing an area occupied by a capacitor included in a pixel of a display device in a plan view. In addition, this facilitates implementation of a high-resolution display device.

An embodiment of a display device includes: a substrate; a first conductive layer disposed on the substrate; a first insulating layer positioned on the first conductive layer and having an undercut structure forming an opening; a first capacitor electrode including a portion formed in the undercut structure; a second capacitor electrode including a portion formed in the undercut structure and overlapping the second capacitor electrode to form a capacitor; and a second insulating layer including a portion formed in the undercut structure and positioned between the first capacitor electrode and the second capacitor electrode to function as a dielectric of the capacitor.

The undercut structure may include a first side surface of the first insulating layer forming the opening, a lower surface connected to the first side surface, and a second side surface connected to the lower surface.

The first capacitor electrode formed in the undercut structure may include: a first bottom portion parallel to an upper surface of the substrate; a first undercut side portion connected to the first bottom portion; and a first undercut upper portion connected to the first undercut side portion.

The second capacitor electrode formed in the undercut structure may include a second bottom portion facing and overlapping the first bottom portion.

The second bottom portion may be positioned between the first bottom portion and the first undercut upper portion in a cross-sectional view.

The second bottom portion may overlap a protrusion of the first insulating layer positioned on the lower surface.

The first capacitor electrode may further include: a first side portion connected to the first undercut upper portion; and a first upper portion connected to the first side portion and positioned on an upper surface of the first insulating layer.

The second capacitor electrode may include: a second side portion connected to the second bottom portion and facing the first side portion; and a second upper portion connected to the second side portion and facing the first upper portion.

The protrusion of the first insulating layer, the first bottom portion, the first undercut upper portion and the first upper portion of the first capacitor electrode, the second bottom portion and the second upper portion of the second capacitor electrode may overlap each other in a direction that is perpendicular to the upper surface of the substrate.

It may further include a first transistor, a second transistor and a third transistor positioned on the substrate, the first capacitor electrode may be electrically connected to a gate electrode of the first transistor, and the second capacitor electrode electrically connected to a first conductive region of the first transistor and a first conductive region of the third transistor.

A second conductive region of the first transistor may be able to receive a driving voltage, and a second conductive region of the third transistor may be able to receive an initialization voltage.

The first conductive layer may include a conductive pattern overlapping the gate electrode of the first transistor.

An embodiment of the present invention provides a display device including: a substrate; and a capacitor positioned on the substrate, wherein the capacitor includes: a first bottom portion of a first conductive layer positioned on the substrate; a second bottom portion of a second conductive layer positioned on the first bottom portion of the first conductive layer to overlap the first bottom portion; an undercut upper portion of the first conductive layer positioned on the second bottom portion of the second conductive layer to overlap the second bottom portion, wherein a continuous first insulating layer insulating between the first conductive layer and the second conductive layer includes a portion positioned between the first bottom portion of the first conductive layer and the second bottom portion of the second conductive layer, and a portion positioned between the second bottom portion of the second conductive layer and the undercut upper portion of the first conductive layer, and the first bottom portion of the first conductive layer and the undercut upper portion of the first conductive layer are integrally formed as one continuous conductive layer.

The first conductive layer may further include an undercut side portion connecting between the first bottom portion of the first conductive layer and the undercut upper portion of the first conductive layer, and facing a side surface of the second bottom portion of the second conductive layer with the first insulating layer therebetween.

The first conductive layer may further include a first side portion connected to the undercut upper portion of the first conductive layer and not parallel to an upper surface of the substrate, and the second conductive layer may further include a second side portion connected to the second bottom portion of the second conductive layer and facing the first side portion of the first conductive layer with the first insulating layer therebetween.

The first conductive layer further may include a first upper portion connected to the first side portion of the first conductive layer and parallel to the upper surface of the substrate, and the second conductive layer may further include a second upper portion connected to the second side portion of the second conductive layer and facing the first upper portion of the first conductive layer with the first insulating layer therebetween.

It may further include a second insulating layer including a protrusion positioned between the first upper portion of the first conductive layer and the undercut upper portion, and the undercut upper portion of the first conductive layer and the first upper portion face each other with the second insulating layer therebetween.

An embodiment of the present invention provides a manufacturing method of a display device, including: forming a first pattern on a substrate; forming an opening positioned over the first pattern by stacking a first insulating layer on the first pattern and patterning the first insulating layer; forming an undercut structure of the first insulating layer by removing the first pattern through the opening; forming a first capacitor electrode including a portion formed in the undercut structure by stacking a first conductive layer on the substrate on which the first insulating layer is formed and patterning it; stacking a second insulating layer including a portion formed in the undercut structure on the substrate on which the first capacitor electrode is formed; and forming a second capacitor electrode including a portion formed in the undercut structure by stacking a second conductive layer on the substrate on which the second insulating layer is formed and patterning it.

The removing of the first pattern may use isotropic etching.

The stacking method of at least one of the first conductive layer, the second insulating layer, and the second conductive layer may include an atomic layer deposition method.

According to the embodiments, it is possible to secure sufficient capacitor capacity without increasing an area occupied by a capacitor included in a pixel of a display device in a plan view. In addition, it is possible to facilitate implementation of a high-resolution display device.

DETAILED DESCRIPTION OF THE EMBODIMENTS

Figure 1:
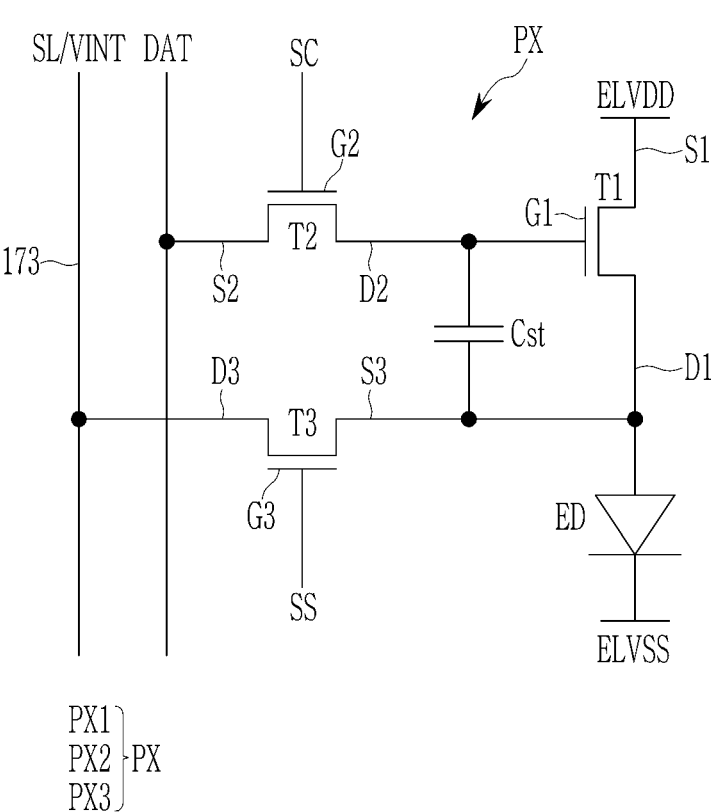
FIG. 1 illustrates a circuit diagram for one pixel of a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" and "comprising" as well as the word "include" and variations such as "includes" and "including" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

First, a display device according to an embodiment will now be described with reference to FIG. 1.

FIG. 1 illustrates a circuit diagram for one pixel of a display device according to an embodiment.

A display device according to an embodiment may include a plurality of pixels PX as a unit capable of displaying an image, and as illustrated in FIG. 1, one pixel PX may include a pixel circuit including a plurality of transistors T1, T2, and T3 and a capacitor Cst, and at least one light emitting diode ED connected to the pixel circuit. In the present embodiment, an example in which one pixel PX includes one light emitting diode ED will be mainly described.

The transistors T1, T2, and T3 includes a first transistor T1 as a driving transistor, and a second transistor T2 and a third transistor T3 as switching transistors. The transistor T1, T2, and T3 include gate electrodes G1, G2, and G3, first electrodes S1, S2, and S3, and second electrodes D1, D2, and D3, respectively, and also include a semiconductor layer including a channel, so that a current flows or is blocked in a channel of the semiconductor layer depending on voltages of the gate electrodes G1, G2, and G3. Herein, in the first electrodes S1, S2, and S3 and the second electrodes D1, D2, and D3, one of the two electrodes may be a source electrode and the other may be a drain electrode depending on a voltage applied to each of the transistors T1, T2, and T3.

The gate electrode G1 of the first transistor T1 is connected to a first end of the capacitor Cst, the first electrode S1 of the first transistor T1 is connected to a driving voltage line that transfers the driving voltage ELVDD, and the second electrode D1 of the first transistor T1 is connected to an anode of the light emitting diode ED and a second end of the capacitor Cst. The first transistor T1 may receive a data voltage DAT through the gate electrode G1 depending on a switching operation of the second transistor T2, and a driving current may be supplied to the light emitting diode ED depending on a voltage of the gate electrode G1. In this case, the capacitor Cst stores and maintains a voltage of the gate electrode G1 of the first transistor T1.

The gate electrode G2 of the second transistor T2 is connected to a first scan line transferring a first scan signal SC, the first electrode S2 of the second transistor T2 is connected to a data line transferring a data voltage DAT, and the second electrode D2 of the second transistor T2 is connected to the first end of the capacitor Cst and the gate electrode G1 of the first transistor T1. The second transistor T2 may be turned on depending on the first scan signal SC to transfer the data voltage DAT to the gate electrode G1 of the first transistor T1 and the first end of the capacitor Cst.

The gate electrode G3 of the third transistor T3 is connected to a second scan line transferring a second scan signal SS, the first electrode S3 of the third transistor T3 is connected to the second end of the capacitor Cst, the second electrode D1 of the first transistor T1, and the anode of the light emitting diode ED, and the second electrode D3 of the third transistor T3 is connected to an initialization voltage line 173 transferring an initialization voltage VINT. The third transistor T3 may be turned on depending on the second scan signal SS, to initialize a voltage of the anode of the light emitting diode ED by transferring the initialization voltage VINT to the anode of the light emitting diode ED and the second end of the capacitor Cst.

The initialization voltage line may function as a detection line SL that detects a voltage of the anode of the light emitting diode ED before applying the initialization voltage VINT. Through a detection operation, it may be confirmed whether the voltage of the anode is maintained at a target voltage. The detection operation and the initialization operation of transferring the initialization voltage VINT may be separated in time and proceed, and after the detection operation is performed, an initialization operation may be performed.

The first end of the capacitor Cst is connected to the gate electrode G1 of the first transistor T1, and the second end is connected to the first electrode S3 of the third transistor T3 and the anode of the light emitting diode ED. A cathode of the light emitting diode ED is connected to a common voltage line transferring a driving low voltage ELVSS.

The light emitting diode ED may emit light having luminance depending on a driving current generated by the first transistor T1.

According to an embodiment, a structure of the pixel PX included in the display device is not limited to the circuit diagram illustrated in FIG. 1, and may have various pixel structures depending on a type of display device.

Next, an operation of one pixel PX will be briefly described with reference to FIG. 1.

When the third transistor T3 is turned on depending on a second scan signal SS, an initialization operation or a detection operation may be performed. Herein, an embodiment in which both the initialization operation and the detection operation are performed will be mainly described.

The detection operation may be performed first before the initialization operation is performed. That is, when the third transistor T3 is turned on, the initialization voltage line 173 serves as a detection line SL to detect the voltage of the anode of the light emitting diode ED. Through the detection operation, it may be confirmed whether the voltage of the anode is maintained at a target voltage.

The initialization operation may be performed after the detection operation. In the initialization operation, voltages of the second end of the capacitor Cst, the second electrode D1 of the first transistor T1, and the anode of the light emitting diode ED may be changed to the initialization voltage VINT transferred from the initialization voltage line 173.

The detection operation and the initialization operation that delivers the initialization voltage VINT may be divided in time so that the pixel PX may perform various operations while reducing an area occupied by the pixel PX while using a minimum number of transistors. As a result, resolution of the display device may be improved.

The second transistor T2 may be turned on depending on the first scan signal SC along with the initialization operation or at separate timing, and a write operation may be performed. That is, a data voltage DAT is input to the gate electrode G1 of the first transistor T1 and the first end of the capacitor Cst through the turned-on second transistor T2 to be stored therein.

The data voltage DAT and the initialization voltage VINT are respectively applied to opposite ends of the capacitor Cst by the initialization operation and the write operation. In a state in which the third transistor T3 is turned on, even when an output current is generated in the first transistor T1, it may be outputted to the outside through the third transistor T3 and the initialization voltage line 173, and thus it may not be inputted to the light emitting diode ED. In addition, according to another embodiment, a driving voltage ELVDD is applied as a low level voltage during the write period, or a current may not flow through the light emitting diode ED by applying the driving low voltage ELVSS as a high level voltage.

Then, when the second transistor T2 is turned off depending on the first scan signal SC, the first transistor T1 generates and outputs an output current by the high level driving voltage ELVDD applied to the first transistor T1 and a gate voltage of the first transistor T1 stored in the capacitor Cst. The output current of the first transistor T1 is inputted to the light emitting diode ED, so that a light emitting period in which the light emitting diode ED emits light proceeds.

Next, a detailed structure of a display device according to an embodiment will be described with reference to FIG. 2 to FIG. 4 together with FIG. 1.

Figure 2:
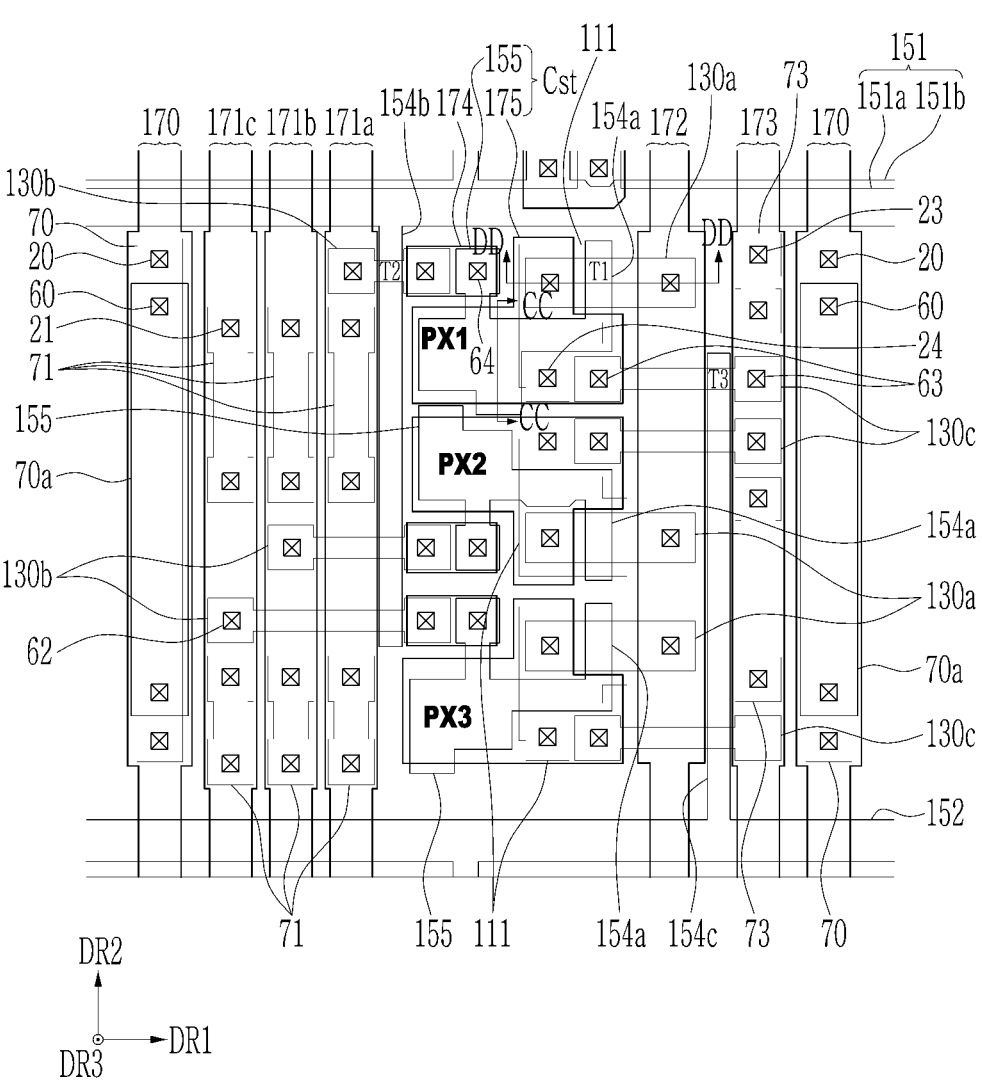
FIG. 2 illustrates a top plan view of a plurality of pixels in a display device according to an embodiment.
Figure 3:
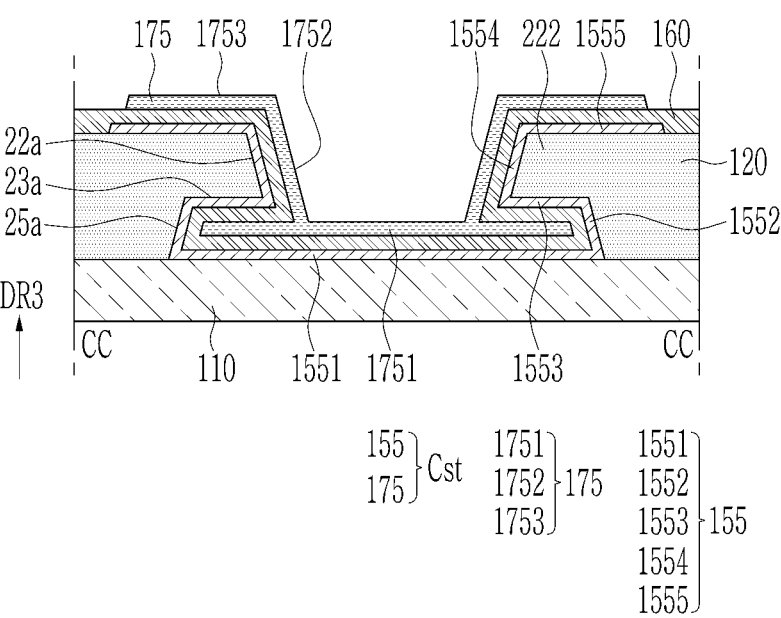
FIG. 3 illustrates a cross-sectional view of the display device taken along a line CC-CC of FIG. 2.
Figure 4:
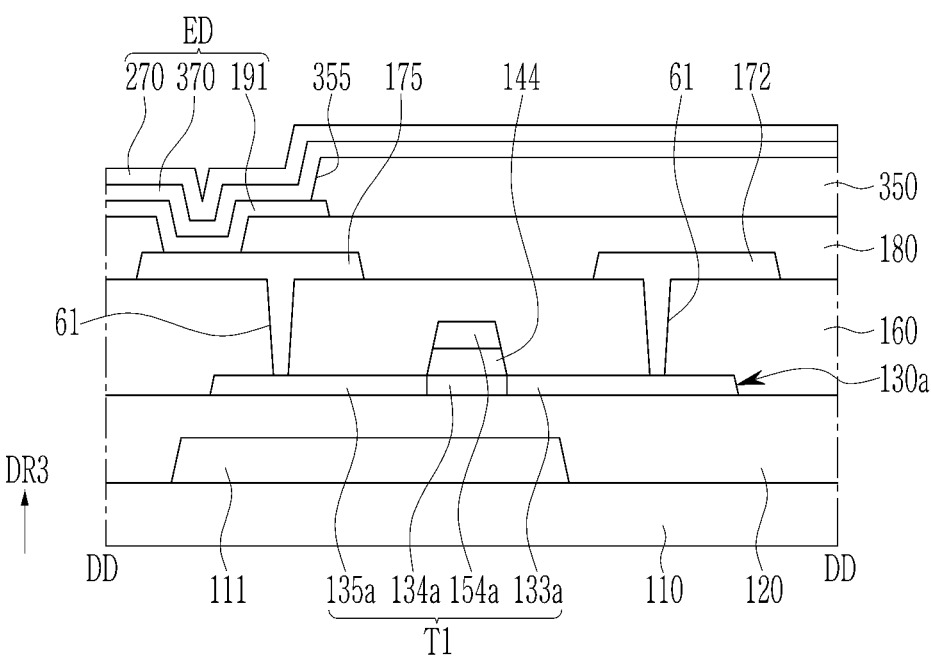
FIG. 4 illustrates a cross-sectional view of the display device taken along a line DD-DD of FIG. 2.

FIG. 2 illustrates a top plan view of a plurality of pixels in a display device according to an embodiment, FIG. 3 illustrates a cross-sectional view of the display device taken along a line CC-CC of FIG. 2, and FIG. 4 illustrates a cross-sectional view of the display device taken along a line DD-DD of FIG. 2.

FIG. 2 illustrates a structure of a pixel circuit unit including a plurality of transistors T1, T2, T3 and a capacitor Cst of a plurality of pixels PX1, PX2, and PX3 in a plan view that is parallel to a first direction DR1 and a second direction DR2 perpendicular thereto, and an anode of the light emitting diode ED and a structure thereon are not illustrated. Referring to FIG. 2, a plurality of pixel circuit units of the pixels PX1, PX2, and PX3 are arranged in the second direction DR2. A first pixel circuit unit belonging to a first pixel PX1 is positioned at the top, a second pixel circuit unit belonging to a second pixel PX2 is positioned below it, and a third pixel circuit unit belonging to a third pixel PX3 is positioned at the bottom. In this description, three adjacent pixels PX1, PX2, and PX3 are also referred to as one pixel group.

Referring to FIG. 3 and FIG. 4 together with FIG. 2, which illustrate a stacked structure in a third direction DR3 perpendicular to the plan view, a display device according to an embodiment may include a substrate 110. The substrate 110 may include an insulating material such as glass, plastic, or the like, and may have flexibility.

A first conductive layer including a conductive pattern 111, a signal line, and a connecting member may be positioned on the substrate 110. A signal line of the first conductive layer may include a lower wire 151a of a first scan line capable of transferring the first scan signal SC described above. The connecting member of the first conductive layer may include a plurality of connecting members 70, 71, and 73.

A conductive pattern 111, which has an island shape, may be positioned in each of the pixels PX1, PX2, and PX3.

In a plan view, the lower wire 151a of the first scan line 151 may extend substantially in the first direction DR1.

Each of the connecting members 70, 71, and 73 may extend substantially in the second direction DR2.

A buffer layer 120 as a first insulating layer may be disposed on the first conductive layer.

The buffer layer 120 has an undercut structure positioned in a region where the capacitor Cst of each of the pixels PX1, PX2, and PX3 is to be formed. The undercut structure of the buffer layer 120 may include a first side surface 25a, a bottom surface 23a, and a second side surface 22a sequentially connected upward from an upper surface of the substrate 110. The second side surface 22a of the buffer layer 120 may have an edge positioned inside an edge of the lower first side surface 25a to form a protrusion 222 of the buffer layer 120.

A semiconductor layer including a plurality of semiconductor patterns 130a, 130b, and 130c may be disposed on the buffer layer 120. The semiconductor patterns 130a, 130b, and 130c positioned at the pixels PX1, PX2, and PX3 may respectively include channel regions 134a forming channels of the transistors T1, T2, and T3 described above and conductive regions connected thereto. A conductive region of each of the semiconductor patterns 130a, 130b, and 130c may include a first conductive region 133a and a second conductive region 135a of each of the transistors T1, T2, and T3.

The semiconductor patterns 130a, 130b, and 130c positioned in the respective pixels PX1, PX2, and PX3 may be spaced apart from each other, but the present disclosure is not limited thereto.

The semiconductor layer may include a semiconductor material such as amorphous silicon, polysilicon, or an oxide semiconductor, e.g., an IGZO.

A gate insulating pattern 144 as a second insulating layer may be positioned on the semiconductor layer. The gate insulating pattern 144 may overlap the channel region 134a of each of the semiconductor patterns 130a, 130b, and 130c and may be positioned on the channel region 134a. The gate insulating pattern 144 may not substantially overlap the conductive region of the semiconductor pattern 130a, and may have an edge aligned with the corresponding edge of the channel region 134a.

A second conductive layer may be disposed on the second insulating layer.

The second conductive layer may include an upper wire 151b of the first scan line capable of transferring the first scan signal SC described above, a second scan line 152 capable of transferring the second scan signal SS, a first capacitor electrode 155, a first gate electrode 154a, a second gate electrode 154b, a third gate electrode 154c, a connecting member 70a, etc. The gate electrodes G1, G2, and G3 described above may correspond to the first gate electrode 154a, the second gate electrode 154b, and the third gate electrode 154c, respectively.

The first gate electrode 154a crosses the semiconductor pattern 130a, and overlaps the channel region 134a of the semiconductor pattern 130a. The first gate electrode 154a is connected to the first capacitor electrode 155, and may be integrally formed therewith. The first gate electrode 154a forms a first transistor T1 together with the semiconductor pattern 130a.

The channel region 134a of the first transistor T1 may overlap the conductive pattern 111.

First capacitor electrodes 155 may be positioned to correspond to the respective pixels PX1, PX2, and PX3. A cross-sectional structure of the first capacitor electrodes 155 will be described in detail later.

The upper wire 151b of the first scan line may extend substantially in the first direction DR1, and may overlap the lower wire 151a of the first scan line. The upper wire 151b of the first scan line may contact and be electrically connected to the lower wire 151a through an opening of the second insulating layer, and the upper wire 151b and the lower wire 151a of the first scan line together form the first scan line 151 transferring the first scan signal SC.

The second gate electrodes 154b belonging to the pixels PX1, PX2, and PX3 may be connected to each other to form a shape extending in the second direction DR2 as a whole, and may be electrically connected with the first scan line 151. The second gate electrode 154b crosses the semiconductor pattern 130b of each of the pixels PX1, PX2, and PX3, and overlaps the channel region of the semiconductor pattern 130b. The second gate electrode 154b forms the second transistor T2 together with the semiconductor pattern 130b.

In a plan view, the second scan line 152 extends approximately in the first direction DR1, and is spaced apart from the first scan line 151 in the second direction DR2. A pixel circuit unit of one pixel group may be positioned between the first scan line 151 and the second scan line 152 in a plan view.

The third gate electrodes 154c belonging to the pixels PX1, PX2, and PX3 may be connected to each other to form a shape extending in the second direction DR2 as a whole, and may be electrically connected with the second scan line 152. The third gate electrode 154c crosses the semiconductor pattern 130c of each of the pixels PX1, PX2, and PX3, and overlaps the channel region of the semiconductor pattern 130c. The third gate electrode 154c forms the third transistor T3 together with the semiconductor pattern 130c The connecting member 70a overlaps with the connecting member 70 of the first conductive layer, and may extend approximately in the second direction DR2.

A third insulating layer 160 may be disposed on the second conductive layer. The third insulating layer 160 also has an undercut structure positioned in a region where the capacitor Cst of each of the pixels PX1, PX2, and PX3 is to be formed. The undercut structure of the third insulating layer 160 may be formed depending on the corresponding undercut structure of the buffer layer 120.

The buffer layer 120 and the third insulating layer 160 may include an opening 20 positioned above the connecting member 70, an opening 21 positioned above the connecting member, an opening 23 positioned above the connecting member 73, and an opening 24 positioned over the conductive pattern 111. The third insulating layer 160 may include an opening 60 positioned above the connecting member 70a, an opening 64 positioned above the first capacitor electrode 155, a plurality of openings 61 positioned above the semiconductor pattern 130a, a plurality of openings 62 positioned on the semiconductor pattern 130b, and a plurality of openings 63 positioned on the semiconductor pattern 130c.

A third conductive layer may be disposed on the third insulating layer 160.

The third conductive layer may include a driving low voltage line 170, a plurality of data lines 171a, 171b, and 171c, a driving voltage line 172, an initialization voltage line 173, a second capacitor electrode 175, and a connecting member 174. In a plan view, each of the driving low voltage line 170, the data lines 171a, 171b, and 171c, the driving voltage line 172, and the initialization voltage line 173 may extend substantially in the second direction DR2.

In a plan view, the driving low voltage line 170 may overlap the connecting member 70 of the first conductive layer and the connecting member 70a of the second conductive layer, and may extend substantially in the second direction DR2.

The driving low voltage line 170 may contact and may be electrically connected to the connection member 70a of the second conductive layer through at least one of the opening 20 and the opening 60, each of the data lines 171a, 171b, and 171c may contact and may be electrically connected to the connecting member 71 of the first conductive layer through the opening 21, and the initialization voltage line 173 may contact and may be electrically connected to the connecting member 73 of the first conductive layer through the opening 23. Accordingly, the driving low voltage line 170, the data lines 171a, 171b, and 171c, and the initialization voltage line 173 each transmit voltages or signals through the double layer in some sections, so that wire resistance may be reduced.

Each of the data lines 171a, 171b, and 171c may contact and may be electrically connected to a conductive region of the semiconductor pattern 130b belonging to the corresponding pixels PX1, PX2, and PX3 through the opening 62, to transfer the data voltage DAT to the semiconductor pattern 130b.

The driving voltage line 172 may contact and may be electrically connected to a conductive region of the semiconductor pattern 130a belonging to the corresponding pixels PX1, PX2, and PX3 through one opening 61, to transfer the driving voltage ELVDD to the semiconductor pattern 130a.

The initialization voltage line 173 may contact and may be electrically connected to a conductive region of the semiconductor pattern 130c belonging to the corresponding pixels PX1, PX2, and PX3 through one opening 63 to transfer the initialization voltage VINT to the semiconductor pattern 130c.

The connecting member 174 may electrically connect a conductive region of the semiconductor pattern 130b to the first capacitor electrode 155 or the first gate electrode 154a through the openings 62 and 64 in each of the pixels PX1, PX2, and PX3.

The second capacitor electrode 175 may contact and may be electrically connected to a conductive region positioned at an opposite side of the driving voltage line 172 among conductive regions of the semiconductor pattern 130b of the second transistor T2 through another opening 61 in each of the pixels PX1, PX2, and PX3. The second capacitor electrode 175 overlaps the first capacitor electrode 155 in a plan view to form the capacitor Cst. The third insulating layer 160 positioned between the first capacitor electrode 155 and the second capacitor electrode 175 may function as a dielectric material.

The second capacitor electrode 175 may be electrically connected to the conductive pattern 111 through the opening 24. In addition, the second capacitor electrode 175 may contact and may be electrically connected to a conductive region positioned at an opposite side of the initialization voltage line 173 among conductive regions of the semiconductor pattern 130c of the third transistor T3 through another opening 63.

Referring to FIG. 3, according to an embodiment, the first capacitor electrode 155 constituting the capacitor Cst may have an undercut structure in a cross-sectional view. Specifically, the first capacitor electrode 155 may include a bottom portion 1551, an undercut side portion 1552, an undercut upper portion 1553, a side portion 1554, and an upper portion 1555.

The bottom portion 1551 may be positioned at a lower-most portion of the first capacitor electrode 155, and may be substantially parallel to an upper surface of the substrate 110. According to an embodiment, the bottom portion 1551 may contact the upper surface of the substrate 110.

The undercut side portion 1552 extends from an edge of the bottom portion 1551, and has a surface that is not parallel to the upper surface of the substrate 110. According to an embodiment, the undercut side portion 1552 may contact a first side surface 25a of the buffer layer 120. The undercut side portion 1552 may form an angle of about 45 degrees or more and about 135 degrees or less with the bottom portion 1551, but the present disclosure is not limited thereto.

The undercut upper portion 1553 may extend from an edge of the undercut side portion 1552, and may have a surface that is more parallel to the upper surface of the substrate 110 than the undercut side portion 1552. According to an embodiment, the undercut upper portion 1553 may contact a lower surface 23a of the buffer layer 120. The undercut upper portion 1553 may form an angle of about 45 degrees or more and about 135 degrees or less with the undercut side portion 1552, but the present disclosure is not limited thereto.

The side portion 1554 extends from an edge of the undercut upper portion 1553, and has a surface that is not parallel to the upper surface of the substrate 110. According to an embodiment, the side portion 1554 may contact a second side surface 22a of the buffer layer 120. The side portion 1554 may form an angle of about 45 degrees or more and about 135 degrees or less with the undercut upper portion 1553, but the present disclosure is not limited thereto.

The upper portion 1555 may extend from an edge of the side portion 1554, and may have a surface that is more parallel to the upper surface of the substrate 110 than the side portion 1554. According to an embodiment, the upper portion 1555 may contact an upper surface of the buffer layer 120 overlapping the lower surface 23a of the buffer layer 120. The upper portion 1555 may form an angle of about 45 degrees or more and about 135 degrees or less with the side portion 1554, but the present disclosure is not limited thereto.

In a cross-sectional view, the bottom portion 1551, the undercut side portion 1552, the undercut upper portion 1553, the side portion 1554, and the upper portion 1555 of the first capacitor electrode 155 may together form a serpentine shape. An edge portion of the bottom portion 1551, the undercut upper portion 1553, and the upper portion 1555 may be positioned to sequentially overlap in the third direction DR3. The protrusion 222 of the buffer layer 120 may be positioned between the undercut upper portion 1553 and the upper portion 1555 of the first capacitor electrode 155.

The second capacitor electrode 175 may have a shape corresponding to the first capacitor electrode 155 in a cross-sectional view. Specifically, the second capacitor electrode 175 may include a bottom portion 1751, a side portion 1752, and an upper portion 1753.

The bottom portion 1751 may overlap and face the bottom portion 1551 of the first capacitor electrode 155 with the third insulating layer 160 provided therebetween. An edge portion of the bottom portion 1751 of the second capacitor electrode 175 may overlap the bottom portion 1551 of the first capacitor electrode 155 and the undercut top portion 1553 overlapping therewith with the third insulating layer 160 therebetween, and may be surrounded by the bottom portion 1551, the undercut side portion 1552, and the undercut upper portion 1553 of the first capacitor electrode 155. In a plan view or in the third direction DR3, an edge portion of the bottom portion 1751 of the second capacitor electrode 175 overlaps the protrusion 222 of the buffer layer 120. An edge portion of the bottom portion 1751 of the second capacitor electrode 175 includes a portion positioned inside an undercut structure of the buffer layer 120 and an undercut structure of the third insulating layer 160 corresponding thereto.

The side portion 1752 extends upward from a middle portion of the bottom portion 1751, and has a surface that is not parallel to the upper surface of the substrate 110. The side portion 1752 may overlap and face the side portion 1554 of the first capacitor electrode 155 with the third insulating layer 160 provided therebetween.

The upper portion 1753 may extend from an edge of the side portion 1752, and may have a surface that is more parallel to the upper surface of the substrate 110 than the side portion 1752. According to an embodiment, the upper portion 1753 may overlap and face the upper portion 1555 of the first capacitor electrode 155 with the third insulating layer 160 provided therebetween.

In a cross-sectional view, an edge portion of the bottom portion 1751 of the second capacitor electrode 175 and the upper portion 1753 may overlap in the third direction DR3. The protrusion 222 of the buffer layer 120 may be positioned between the bottom portion 1751 and the upper portion 1753 of the second capacitor electrode 175 overlapping in the third direction DR3.

According to an embodiment, the first capacitor electrode 155 and the second capacitor electrode 175 may overlap to form the capacitor Cst even under the protrusion 222 of the buffer layer 120, and the first capacitor electrode 155 and the second capacitor electrode 175 may overlap to form a several-layered or multi-layered capacitor Cst even above the protrusion 222 of the buffer layer 120. The protrusion 222 of the buffer layer 120, at least two portions (the bottom portion 1551 and the undercut upper portion 1553) of the first capacitor electrode 155, and the upper portion 1555 and at least two portions (the bottom portion 1751 and the upper portion 1753) of the second capacitor electrode 175 may overlap each other in the third direction DR3.

Compared to conventional capacitors with two overlapping electrodes facing each other in the form of a plane with one insulating layer provided therebetween, the capacitor Cst according to the embodiment may have larger capacitance with respect to an area in a same plan view since an overlapping portion of the first capacitor electrode 155 and the second capacitor electrode 175 with the third insulating layer 160 therebetween forms several layers. Accordingly, sufficient capacitor capacity may be secured without increasing the area occupied by the capacitor Cst included in the pixel PX in a plan view, and a high-resolution display device may be easily implemented.

In particular, in the case of a pixel circuit unit performing a detection operation, such as the circuit of the pixel PX illustrated in FIG. 1, for an accurate detection (sensing) operation, it is necessary to maintain capacitance of the capacitor Cst at a constant ratio with respect to the first transistor T1. However, when the area occupied by the pixel circuit unit decreases as the display device has higher resolution, a space for forming the capacitor Cst becomes insufficient, and in particular, when it is difficult to reduce the size of the first transistor T1, this may become a further problem. According to the present embodiment, multiple capacitors Cst are formed even within an area of a given plan view, so that sufficient capacitance of the capacitors Cst may be secured.

At least one of the first conductive layer, the second conductive layer, and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. At least one of the first conductive layer, the second conductive layer, and the conductive layer may include a single layer or multiple layers (e.g., Ti/Cu).

A fourth insulating layer 180 may be disposed on the third conductive layer. The fourth insulating layer 180 may include an opening positioned over the second capacitor electrode 175.

At least one of the first insulating layer, the buffer layer 120, the second insulating layer, the third insulating layer 160, and the fourth insulating layer 180 may include an inorganic insulating material or an organic insulating material such as a silicon oxide ($SiO_x$), a silicon oxynitride ($SiO_xN_y$), and a silicon nitride ($SiN_x$). For example, the fourth insulating layer 180 may include an organic insulating material such as polyimide, an acrylic polymer, or a siloxane polymer and may include a substantially flat upper surface, and the third insulating layer 160 may include an inorganic insulating material.

A fourth conductive layer may be disposed on the fourth insulating layer 180. The fourth conductive layer may include a plurality of pixel electrodes 191.

Each of the pixel electrodes 191 may contact and may be electrically connected to the second capacitor electrode 175 through an opening of the fourth insulating layer 180 in each of the pixels PX1, PX2, and PX3, and accordingly, each of the pixel electrodes 191 may be electrically connected to the first transistor T1 of the corresponding pixel PX1, PX2, or PX3.

The fourth conductive layer may include a transflective conductive material or a reflective conductive material.

The conductive pattern 111 corresponding to the first transistor T1 may reduce a leakage current and characteristic deterioration by overlapping the channel region 134a between the channel region 134a of the first transistor T1 and the substrate 110 so as to prevent external light from reaching the channel region 134a.

A fifth insulating layer 350 may be disposed on the fourth conductive layer. The fifth insulating layer 350 may have an opening 355 positioned over each of the pixel electrodes 191.

The fifth insulating layer 350 may include an organic insulating material such as a polyacrylic resin and a polyimide resin.

An emission layer 370 may be disposed on the fifth insulating layer 350 and the pixel electrode 191. The emission layer 370 may include a portion positioned in the opening 355 of the fifth insulating layer 350. The emission layer 370 may include an organic emission material or an inorganic emission material. As illustrated, the emission layer 370 may include a portion positioned on the fifth insulating layer 350, and at least a portion of the fifth insulating layer 350 may not be covered with the emission layer 370.

A fifth conductive layer including a common electrode 270 is disposed on the emission layer 370. The common electrode 270 may be continuously formed across the pixels PX1, PX2, and PX3. The common electrode 270 may be electrically connected to the driving low voltage line 170 to receive the driving low voltage ELVSS.

The fifth conductive layer may include a conductive transparent material, but the present disclosure is not limited thereto.

Each of the pixel electrode 191, the emission layer 370, and the common electrode 270 together form the light emitting diode ED, and one of the pixel electrode 191 and the common electrode 270 serves as a cathode and the other serves as an anode. In the present disclosure, an example in which the pixel electrode 191 serves as an anode of the light emitting diode ED has been described.

In a plan view, an area where the opening 355 of the fifth insulating layer 350 is positioned may define an emission area of each of the pixels PX1, PX2, and PX3.

Next, a manufacturing method of a display device according to an embodiment will be described with reference to FIG. 5 to FIG. 13 together with FIG. 1 to FIG. 4.

Figure 5:
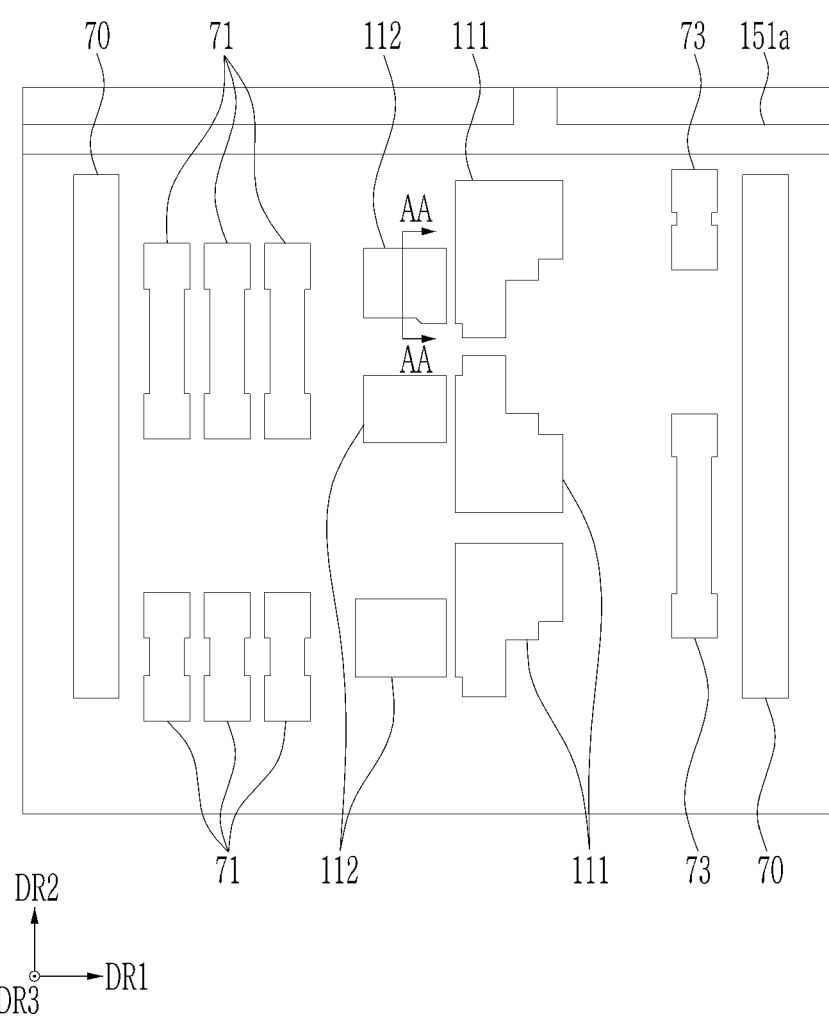
FIG. 5 illustrates a top plan view of a display device in one process step of a manufacturing method of a display device according to an embodiment.
Figure 6:
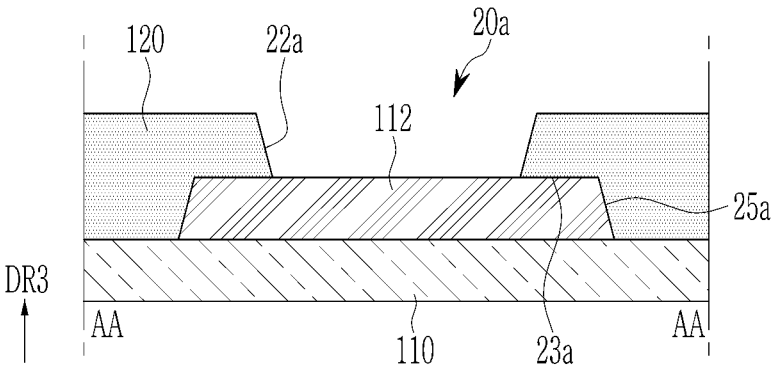
FIG. 6 illustrates a cross-sectional view of the display device taken along a line AA-AA of FIG. 5.
Figure 7:
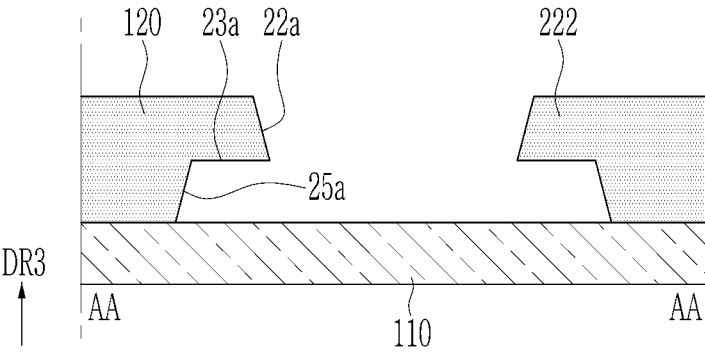
FIG. 7 illustrates a cross-sectional view of a display device taken along a line AA-AA in a process step following the process step illustrated in FIG. 6.
Figure 8:
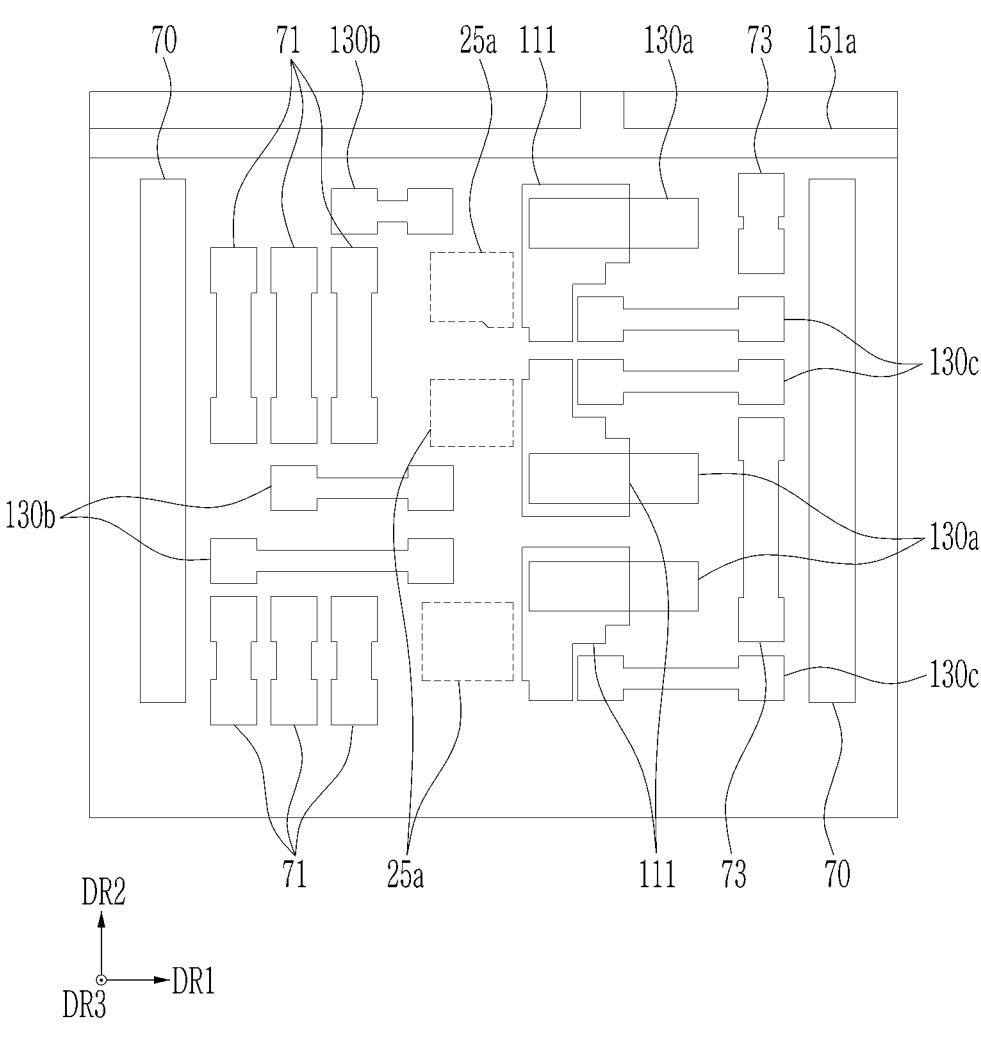
FIG. 8 illustrates a top plan view of the display device in a process step after a manufacturing process step of the display device illustrated in FIG. 7.
Figure 9:
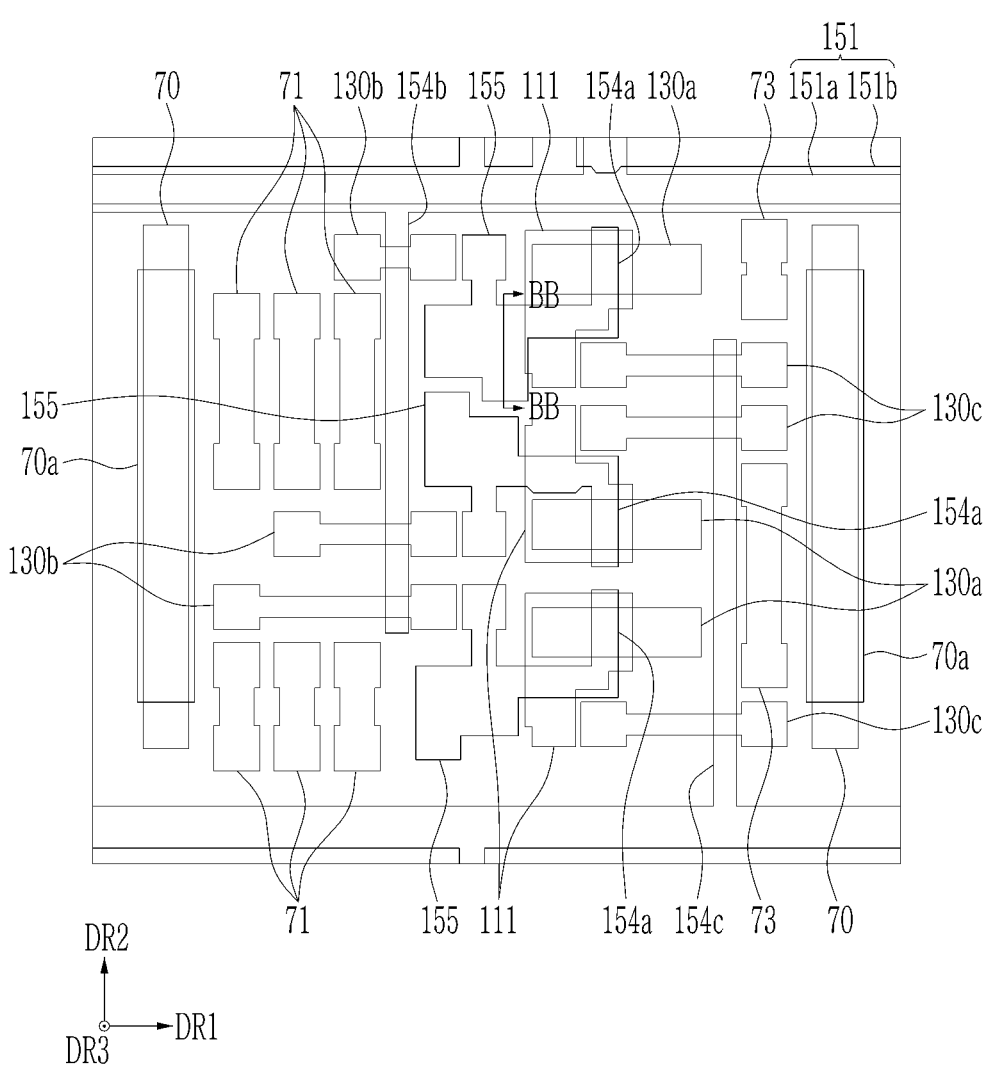
FIG. 9 illustrates a top plan view of the display device in a process step after a manufacturing process step of the display device illustrated in FIG. 8.
Figure 10:
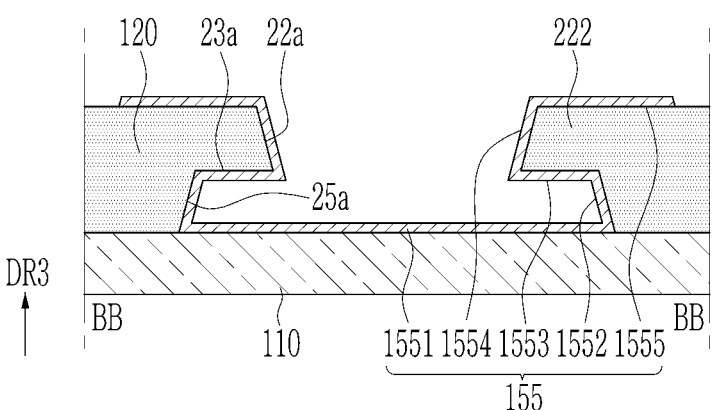
FIG. 10 illustrates a cross-sectional view of the display device taken along a line BB-BB of FIG. 9.
Figure 11:
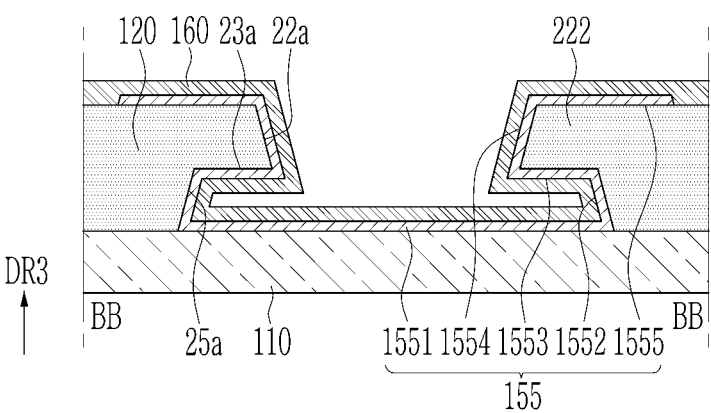
FIG. 11 illustrates a cross-sectional view of a display device taken along a line BB-BB in a process step following the process step illustrated in FIG. 10.
Figure 12:
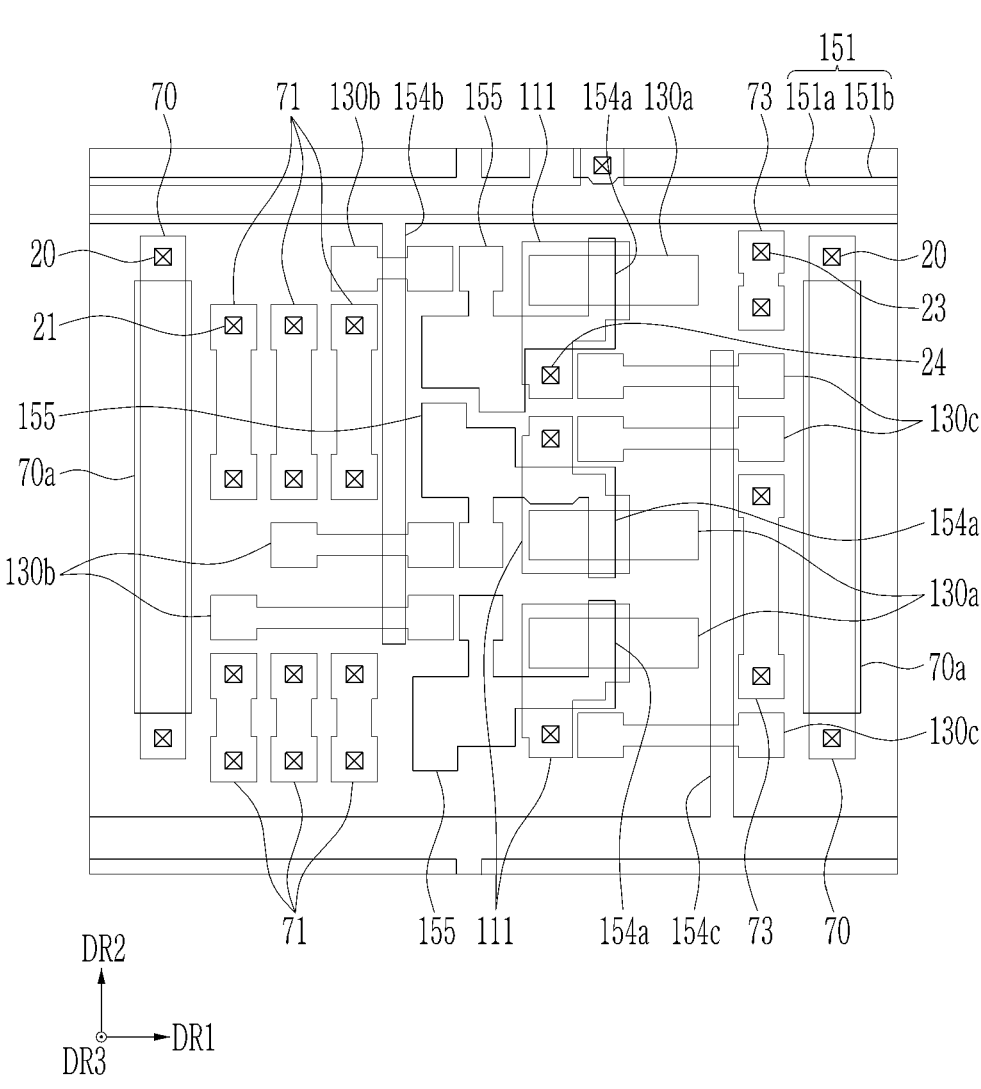
FIG. 12 illustrates a top plan view of the display device in a process step after a manufacturing process step of the display device illustrated in FIG. 11.
Figure 13:
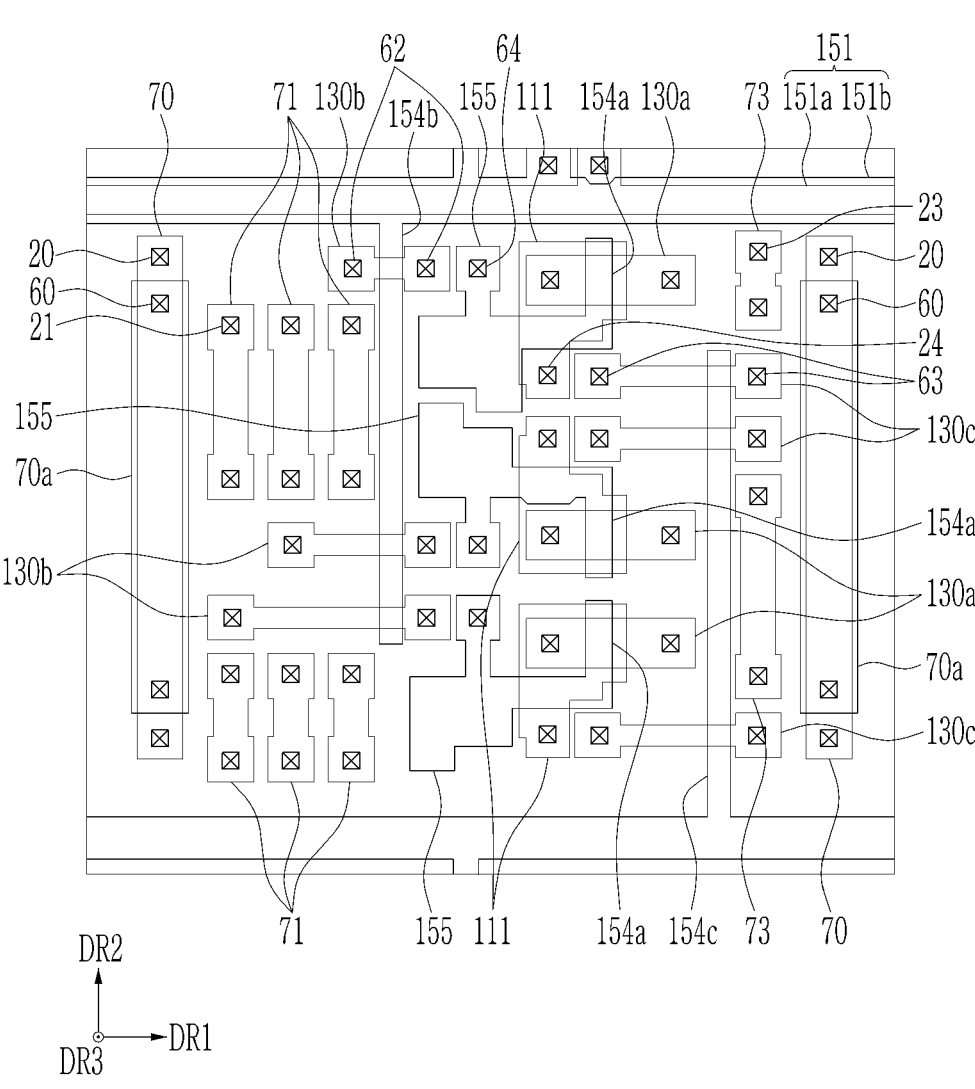
FIG. 13 illustrates a top plan view of the display device in a process step after a manufacturing process step of the display device illustrated in FIG. 12.

FIG. 5 illustrates a top plan view of a display device in one process step of a manufacturing method of a display device according to an embodiment, FIG. 6 illustrates a cross-sectional view of the display device taken along a line AA-AA of FIG. 5, FIG. 7 illustrates a cross-sectional view of a display device taken along a line AA-AA in a process step following the process step illustrated in FIG. 6, FIG. 8 illustrates a top plan view of the display device in a process step after a manufacturing process step of the display device illustrated in FIG. 7, FIG. 9 illustrates a top plan view of the display device in a process step after a manufacturing process step of the display device illustrated in FIG. 8, FIG. 10 illustrates a cross-sectional view of the display device taken along a line BB-BB of FIG. 9, FIG. 11 illustrates a cross-sectional view of a display device taken along a line BB-BB in a process step following the process step illustrated in FIG. 10, FIG. 12 illustrates a top plan view of the display device in a process step after a manufacturing process step of the display device illustrated in FIG. 11, and FIG. 13 illustrates a top plan view of the display device in a process step after a manufacturing process step of the display device illustrated in FIG. 12.

First, referring to FIG. 5 and FIG. 6, a conductive material such as a metal such as titanium (Ti), copper (Cu), aluminum (Al), or molybdenum (Mo) is stacked on an insulating substrate 110 and patterned to form a first conductive layer including the conductive pattern 111, the lower wire 151a of the first scan line, a plurality of connecting members 70, 71, and 73, and a first pattern 112 positioned to correspond to each of the pixels PX1, PX2, and PX3. As a patterning method, photolithography including exposure using a photomask may be used.

Subsequently, an insulating layer is formed by stacking an inorganic insulating material such as a silicon oxide ($SiO_x$), a silicon oxynitride ($SiO_xN_y$), or a silicon nitride ($SiN_x$) on the first conductive layer. According to an embodiment, the insulating layer on the first conductive layer may be, e.g., the buffer layer 120 described above.

Referring to FIG. 6, the buffer layer 120 is patterned by etching or the like to form an opening 20a on the first pattern 112. The opening 20a may be defined by the second side surface 22a of the buffer layer 120, and an edge of the second side surface 22a of the buffer layer 120 is positioned inside an edge of the first side surface 25a of the buffer layer 120 contacting the side surface of the first pattern 112. An upper surface of the first pattern 112 not exposed by the opening 20a may contact the lower surface 23a of the buffer layer 120.

Then referring to FIG. 7, the first pattern 112 is removed through an isotropic etching method such as wet etching through the opening 20a to form an undercut structure by the protrusion 222 in the buffer layer 120. The undercut structure of the buffer layer 120 may be formed by the first side surface 25a, the lower surface 23a, and the second side surface 22a. In the removed first pattern 112, a portion overlapping the buffer layer 120 is removed to form the undercut structure of the buffer layer 120, and thus it may be easy to manage dispersion of the undercut structure of the buffer layer 120 by isotropic etching.

Next, referring to FIG. 8, a semiconductor material such as amorphous silicon, polycrystalline silicon, or an oxide semiconductor is stacked and patterned on the substrate 110 on which the undercut structure of the buffer layer 120 is formed, to form a semiconductor layer including a plurality of semiconductor patterns 130a, 130b, and 130c.

Next, referring to FIG. 9 and FIG. 10, a second conductive layer including the upper wire 151b of the first scan line, the second scan line 152, the first capacitor electrode 155, the first gate electrode 154a, the second gate electrode 154b, the third gate electrode 154c, the connection member 70a, and the like is formed by stacking a conductive material such as a metal on the substrate 110 on which the semiconductor layer is formed and patterning the stacked layers by a method such as photolithography. Referring to FIG. 10, the first capacitor electrode 155 may include a bottom portion 1551, an undercut side portion 1552, an undercut upper portion 1553, a side portion 1554, and an upper portion 1555 formed around the undercut structure of the buffer layer 120.

The second conductive layer is formed to the inside of the undercut structure of the buffer layer 120, so the bottom portion 1551 of the first capacitor electrode 155 and the undercut upper portion 1553 formed on the lower surface 23a of the buffer layer 120 facing the bottom portion 1553 should be spaced apart from each other in the third direction DR3, and accordingly, a method of stacking the second conductive layer that enables such spacing may be used. For example, as the method of stacking the second conductive layer, an atomic layer deposition method may be used.

Next, referring to FIG. 11, an insulating layer is formed by stacking an insulating material on the second conductive layer. The insulating layer formed at this time may be, e.g., the third insulating layer 160 described above. Even in this case, the third insulating layer 160 is formed to the inside of the undercut structure of the buffer layer 120, so that two insulating layers 160 spaced apart between the bottom portion 1551 of the first capacitor electrode 155 and the undercut upper portion 1553 may be formed facing each other, a stacking method that enables such forming may be used. For example, an atomic layer deposition method may be used as a stacking method of the third insulating layer 160.

Referring to FIG. 12 and FIG. 13, a plurality of openings 20, 21, 23, and 24 are formed in the buffer layer 120 and the third insulating layer 160, and a plurality of openings 60, 61, 62, 63, and 64 are formed in the third insulating layer 160. Opening forming steps illustrated in FIG. 12 and FIG. 13 may be performed simultaneously or sequentially. When the opening forming steps illustrated in FIG. 12 and FIG. 13 is sequentially formed, the step of FIG. 12 may be performed before the step of FIG. 13, and the step of FIG. 13 may be performed before the step of FIG. 12.

Next, referring to FIG. 2 and FIG. 3 described above, a conductive material such as a metal is stacked on the third insulating layer 160 and the stacked layer is patterned by a method such as photolithography, to form a third conductive layer including the driving low voltage line 170, a plurality of data lines 171a, 171b, and 171c, the driving voltage line 172, the initialization voltage line 173, the second capacitor electrode 175, and the connecting member 174. Referring to FIG. 3, the second capacitor electrode 175 may include a bottom portion 1751, a side portion 1752, and an upper portion 1753 formed around the undercut structure of the third insulating layer 160 and the buffer layer 120.

Since the third conductive layer must be formed to the inside of the undercut structure of the third insulating layer 160 and the buffer layer 120, a method of stacking the third conductive layer that enables such formation may be used. For example, an atomic layer deposition method may be used as a stacking method of the third conductive layer.

Subsequently, a fourth insulating layer 180, a fourth conductive layer including a plurality of pixel electrodes 191, a fifth insulating layer 350, an emission layer 370, and a fifth conductive layer may be sequentially formed on the third conductive layer.

Examples of the two electrodes forming the capacitor Cst have been described as the second conductive layer and the third conductive layer in the embodiments illustrated in FIG. 2 to FIG. 13, but the present disclosure is not limited thereto. According to an embodiment, the two electrodes forming the capacitor Cst may be formed by a conductive layer other than the second conductive layer and the third conductive layer.

Next, a display device according to an embodiment will be described with reference to FIG. 14 and FIG. 15 together with FIG. 2 to FIG. 4 described above. Descriptions of same characteristics as those of the previously described display devices of FIG. 2 to FIG. 4 will be omitted, and descriptions will focus on differences.

Figure 14:
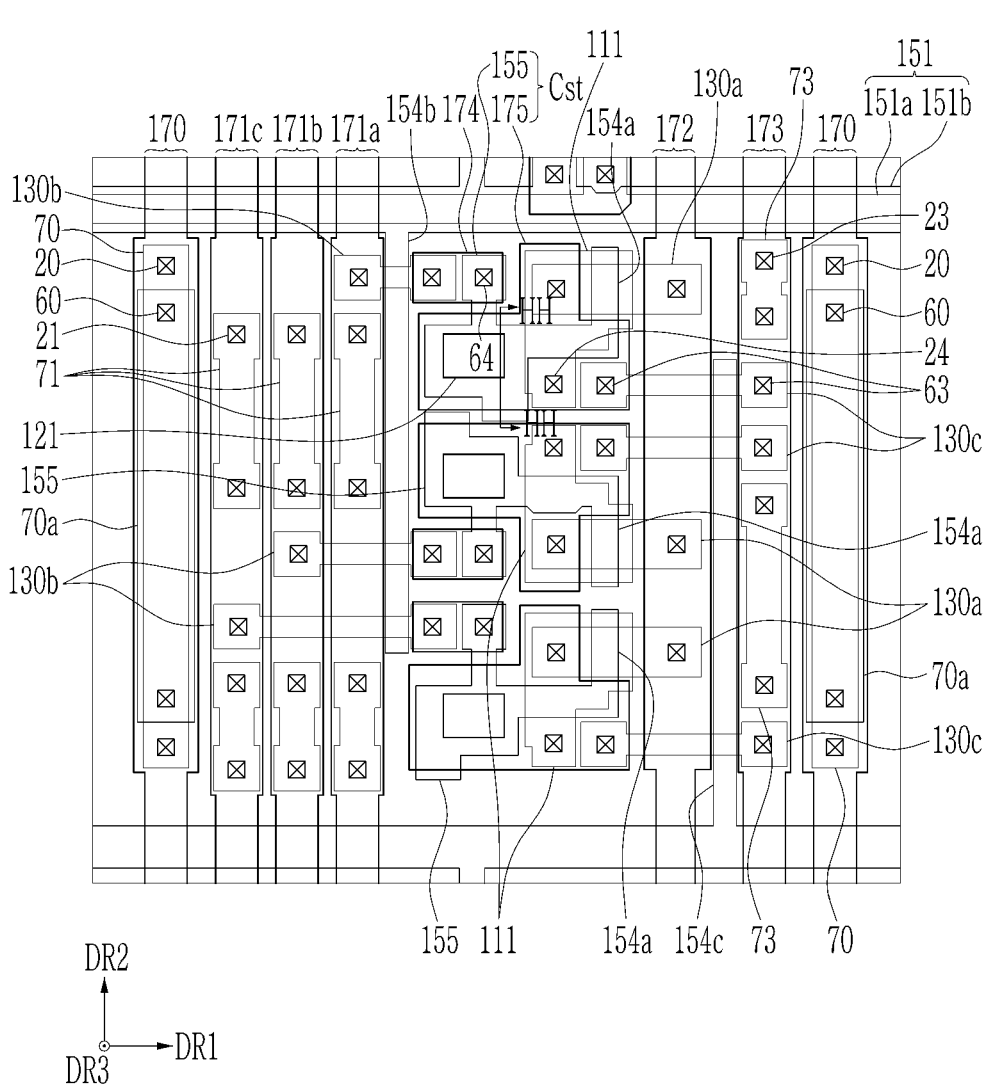
FIG. 14 illustrates a top plan view of a plurality of pixels in a display device according to an embodiment.
Figure 15:
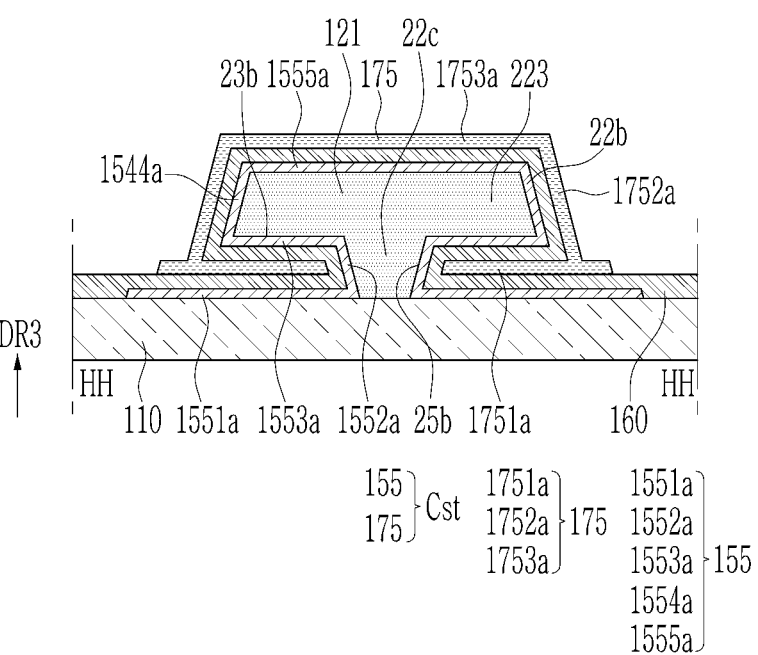
FIG. 15 illustrates a cross-sectional view of the display device taken along a line HH-HH of FIG. 14.

FIG. 14 illustrates a top plan view of a plurality of pixels in a display device according to an embodiment, and FIG. 15 illustrates a cross-sectional view of the display device taken along a line HH-HH of FIG. 14.

Referring to FIG. 14 and FIG. 15, the display device according to the present embodiment is substantially the same as the display device according to the embodiment illustrated in FIG. 2 to FIG. 4 described above, but may have a different stacked structure or cross-sectional structure of the capacitor Cst and surroundings thereof.

The buffer layer 120 on the substrate 110 may include an insulating pattern 121 having an undercut structure positioned in a region where the capacitor Cst of each of the pixels PX1, PX2, and PX3 is to be formed. The insulating pattern 121 may have an island shape that is spaced apart from the surrounding buffer layer 120. The undercut structure of the insulating pattern 121 may include a first side surface 25b, a bottom surface 23b, and a second side surface 22b sequentially connected upward from an upper surface of the substrate 110. The second side surface 22b of the insulating pattern 121 may have an edge positioned outside an edge of the lower first side surface 25b to form a protrusion 223 of the insulating pattern 121. The insulating pattern 121 includes a pillar portion 22c positioned at a lower portion and having a relatively small width, and the pillar portion 22c may be defined by the first side surface 25b. A portion of the insulating pattern 121 that protrudes outward with respect to the pillar portion 22c may correspond to the protrusion 223.

The third insulating layer 160 also has an undercut structure positioned in a region where the capacitor Cst of each of the pixels PX1, PX2, and PX3 is to be formed. The undercut structure of the third insulating layer 160 may be formed depending on the corresponding undercut structure of the buffer layer 120.

Referring to FIG. 15, according to an embodiment, the first capacitor electrode 155 constituting the capacitor Cst may have an undercut structure in a cross-sectional view. Specifically, the first capacitor electrode 155 may include a bottom portion 1551a, an undercut side portion 1552a, an undercut upper portion 1553a, a side portion 1554a, and an upper portion 1555a.

The bottom portion 1551a may be positioned at a lowermost portion of the first capacitor electrode 155, and may be substantially parallel to an upper surface of the substrate 110. According to an embodiment, the bottom portion 1551a may contact the upper surface of the substrate 110.

The undercut side portion 1552a extends from an edge of the bottom portion 1551a, and has a surface that is not parallel to the upper surface of the substrate 110. According to an embodiment, the undercut side portion 1552a may contact the first side surface 25b of the insulating pattern 121, that is, a side surface of the pillar portion 22c. The undercut side portion 1552a may form an angle of about 45 degrees or more and about 135 degrees or less with the bottom portion 1551a, but the present disclosure is not limited thereto.

The undercut upper portion 1553a may extend from an edge of the undercut side portion 1552a, and may have a surface that is more parallel to the upper surface of the substrate 110 than the undercut side portion 1552a. According to an embodiment, the undercut upper portion 1553a may contact the lower surface 23b of the insulating pattern 121. The undercut upper portion 1553a may form an angle of about 45 degrees or more and about 135 degrees or less with the undercut side portion 1552a, but the present disclosure is not limited thereto.

The side portion 1554a extends from the edge of the undercut upper portion 1553a and has a surface that is not parallel to the upper surface of the substrate 110. According to an embodiment, the side portion 1554a may contact the second side surface 22b of the insulating pattern 121. The side portion 1554a may form an angle of about 45 degrees or more and about 135 degrees or less with the undercut upper portion 1553a, but the present disclosure is not limited thereto.

The upper portion 1555a may extend from an edge of the side portion 1554a, and may have a surface that is more parallel to the upper surface of the substrate 110 than the side portion 1554a. According to an embodiment, the upper portion 1555a may contact an upper surface of the insulating pattern 121 overlapping the lower surface 23b of the insulating pattern 121. The upper portion 1555a may form an angle of about 45 degrees or more and about 135 degrees or less with the side portion 1554a, but the present disclosure is not limited thereto.

In a cross-sectional view, the bottom portion 1551a, the undercut side portion 1552a, the undercut upper portion 1553a, the side portion 1554a, and the upper portion 1555a of the first capacitor electrode 155 may together form a serpentine shape. The bottom portion 1551a, the undercut upper portion 1553a, and the upper portion 1555a may be positioned to sequentially overlap in the third direction DR3. The protrusion 223 of the insulating pattern 121 may be positioned between the undercut upper portion 1553a and the upper portion 1555a of the first capacitor electrode 155.

The second capacitor electrode 175 may have a shape corresponding to the first capacitor electrode 155 in a cross-sectional view. Specifically, the second capacitor electrode 175 may include a bottom portion 1751a, a side portion 1752a, and an upper portion 1753a.

The bottom portion 1751a may overlap and face the bottom portion 1551a of the first capacitor electrode 155 with the third insulating layer 160 provided therebetween. The bottom portion 1751a of the second capacitor electrode 175 may overlap the bottom portion 1551a of the first capacitor electrode 155 and the undercut upper portion 1553a overlapping the bottom portion 1551a with the third insulating layer 160 therebetween. In a plan view or in the third direction DR3, the bottom portion 1751a of the second capacitor electrode 175 overlaps the protrusion 223 of the insulating pattern 121. The bottom portion 1751 of the second capacitor electrode 175 includes a portion positioned inside an undercut structure of the insulating pattern 121 and an undercut structure of the third insulating layer 160 corresponding thereto.

The side portion 1752a extends upward from the bottom portion 1751a, and has a surface that is not parallel to the upper surface of the substrate 110. The side portion 1752a may overlap and face the side portion 1554a of the first capacitor electrode 155 with the third insulating layer 160 provided therebetween.

The upper portion 1753a may extend from an edge of the side portion 1752a, and may have a surface that is more parallel to the upper surface of the substrate 110 than the side portion 1752a. According to an embodiment, the upper portion 1753a may overlap and face the upper portion 1555a of the first capacitor electrode 155 with the third insulating layer 160 provided therebetween.

In a cross-sectional view, the bottom portion 1751a and the upper portion 1753a of the second capacitor electrode 175 may overlap each other in the third direction DR3. The protrusion 223 of the insulating pattern 121 may be positioned between the bottom portion 1751a and the upper portion 1753a of the second capacitor electrode 175 overlapping in the third direction DR3.

According to an embodiment, the first capacitor electrode 155 and the second capacitor electrode 175 may overlap to form the capacitor Cst even under the protrusion 223 of the insulating pattern 121, and the first capacitor electrode 155 and the second capacitor electrode 175 may overlap to form a several-layered or multi-layered capacitor Cst even above the protrusion 223 of the insulating pattern 121. The protrusion 223 of the insulating pattern 121 may overlap at least two portions of the first capacitor electrode 155 and at least two portions of the second capacitor electrode 175 in the third direction DR3.

The capacitor Cst according to the present embodiment may have larger capacitance with respect to an area in a same plan view since an overlapping portion of the first capacitor electrode 155 and the second capacitor electrode 175 with the third insulating layer 160 therebetween forms several layers. Accordingly, sufficient capacitor capacity may be secured without increasing the area occupied by the capacitor Cst included in the pixel PX in a plan view, and a high-resolution display device may be easily implemented. That is, multiple capacitors Cst are formed even within an area of a given plan view, so that sufficient capacitance of the capacitors Cst may be secured.

Next, a manufacturing method of a display device according to an embodiment will be described with reference to FIG. 16 to FIG. 22 together with FIG. 14, FIG. 15, and FIG. 5 to FIG. 13 described above. The same description as the manufacturing method according to the above-described embodiment will be omitted and a description will focus on differences.

Figure 16:
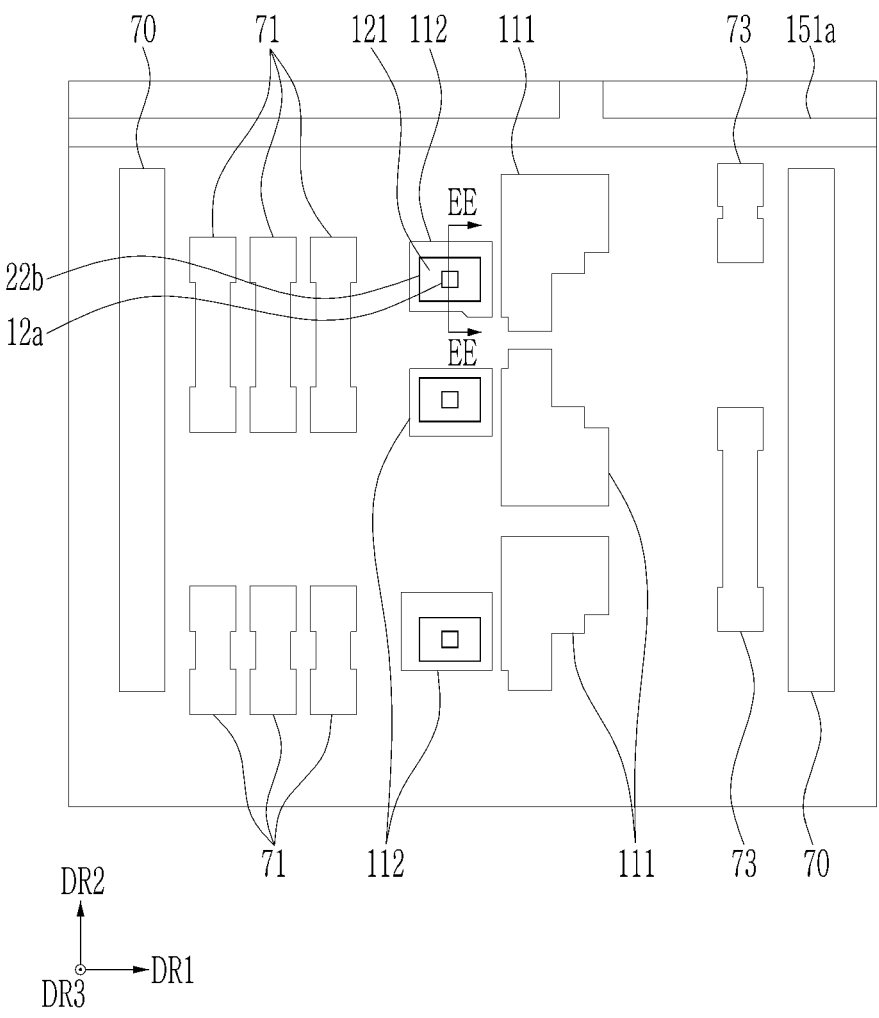
FIG. 16 illustrates a top plan view of a display device in one process step of a manufacturing method of a display device according to an embodiment.
Figure 17:
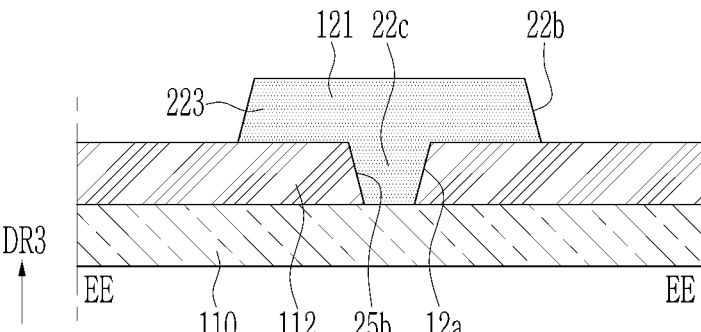
FIG. 17 illustrates a cross-sectional view of the display device taken along a line EE-EE of FIG. 16.
Figure 18:
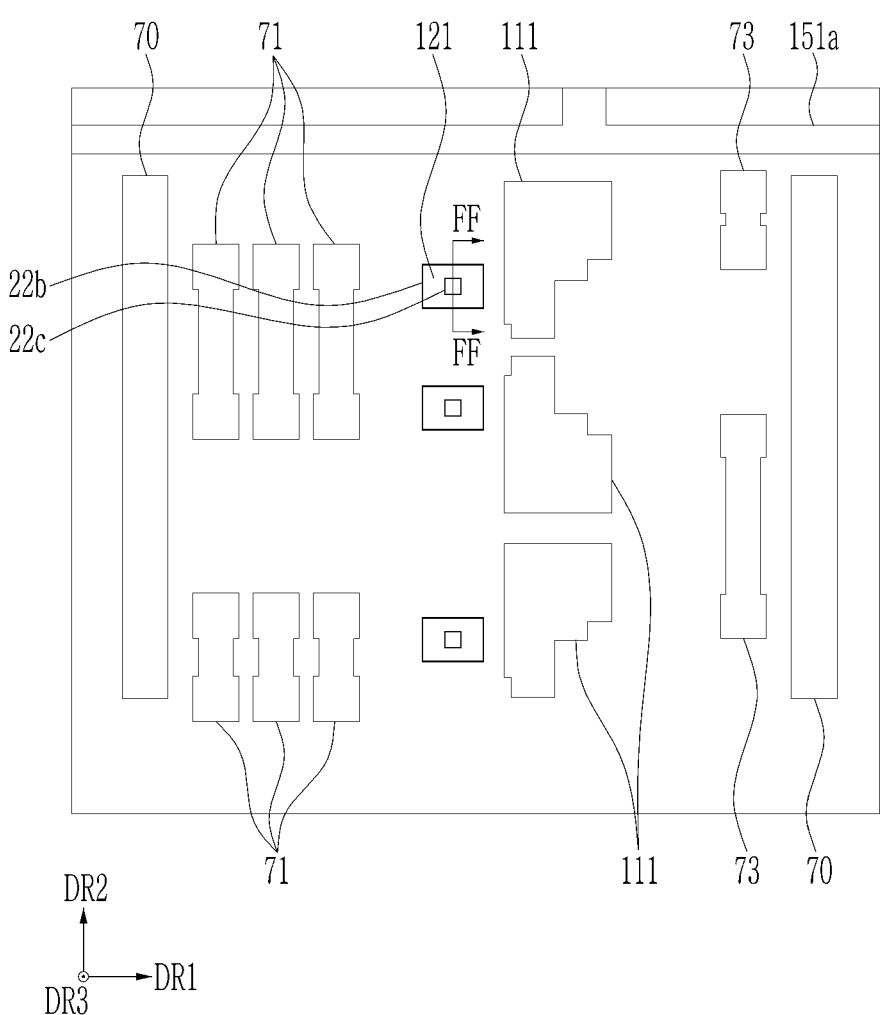
FIG. 18 illustrates a top plan view of the display device in a process step after a manufacturing process step of the display device illustrated in FIG. 16 and FIG. 17.
Figure 19:
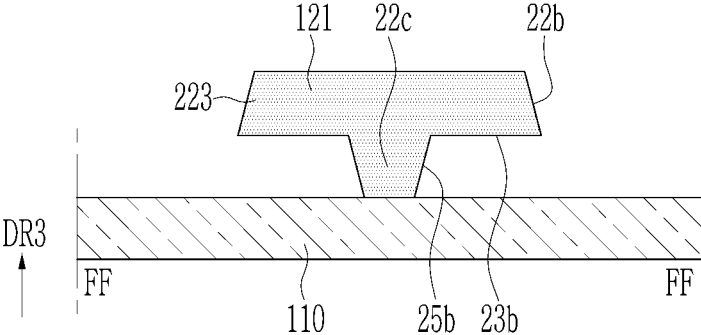
FIG. 19 illustrates a cross-sectional view of the display device taken along a line FF-FF of FIG. 18.
Figure 20:
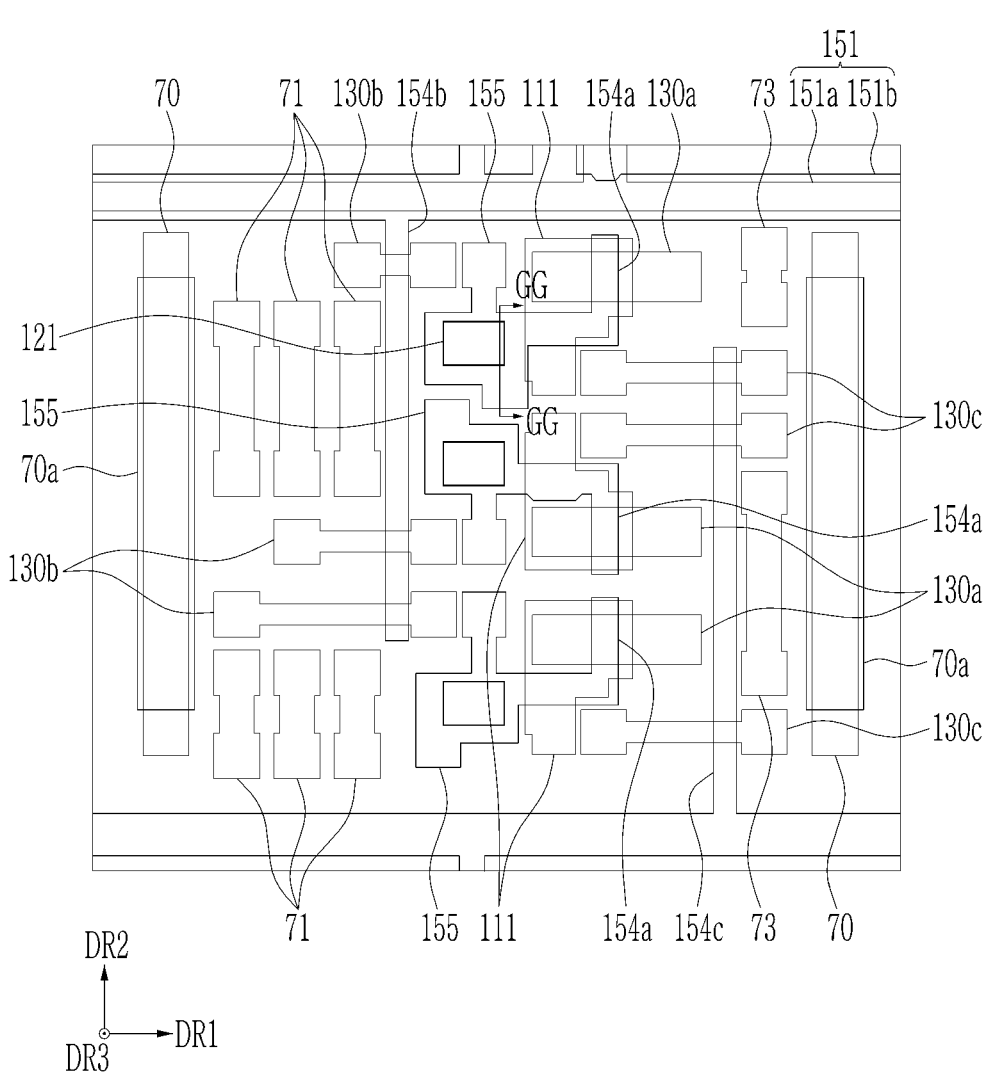
FIG. 20 illustrates a top plan view of the display device in a process step after a manufacturing process step of the display device illustrated in FIG. 18 and FIG. 19.
Figure 21:
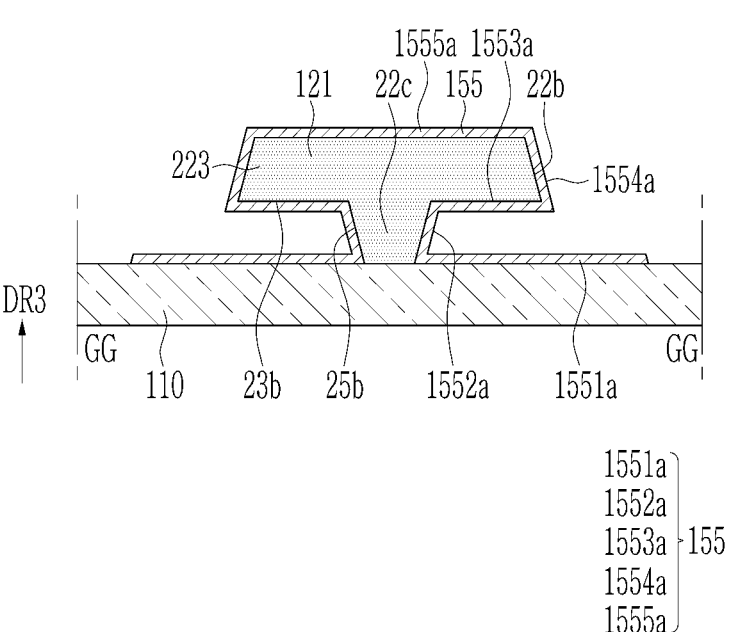
FIG. 21 illustrates a cross-sectional view of the display device taken along a line GG-GG of FIG. 20.
Figure 22:
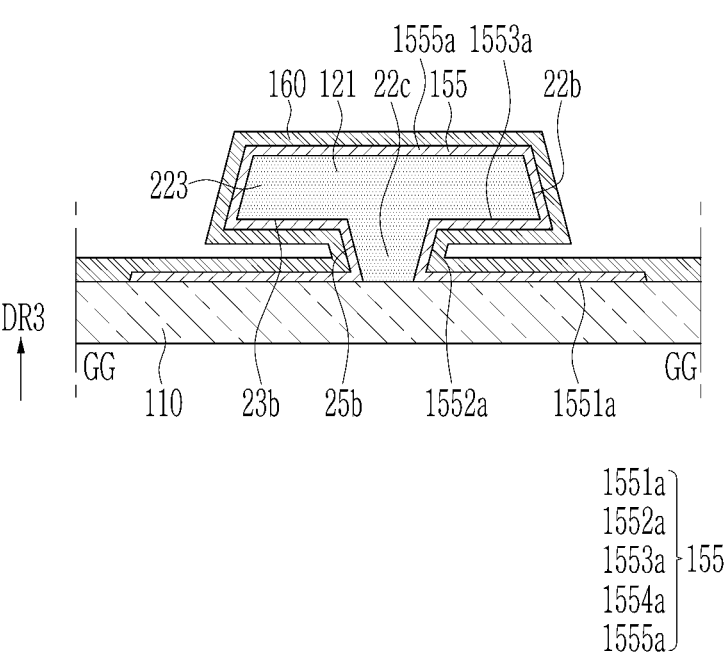
FIG. 22 illustrates a cross-sectional view of a display device taken along a line GG-GG in a process step following the process step illustrated in FIG. 21.

FIG. 16 illustrates a top plan view of a display device in one process step of a manufacturing method of a display device according to an embodiment, FIG. 17 illustrates a cross-sectional view of the display device taken along a line EE-EE of FIG. 16, FIG. 18 illustrates a top plan view of the display device in a process step after a manufacturing process step of the display device illustrated in FIG. 16 and FIG. 17, FIG. 19 illustrates a cross-sectional view of the display device taken along a line FF-FF of FIG. 18, FIG. 20 illustrates a top plan view of the display device in a process step after a manufacturing process step of the display device illustrated in FIG. 18 and FIG. 19, FIG. 21 illustrates a cross-sectional view of the display device taken along a line GG-GG of FIG. 20, and FIG. 22 illustrates a cross-sectional view of a display device taken along a line GG-GG in a process step following the process step illustrated in FIG. 21.

First, referring to FIG. 16 and FIG. 17, a conductive material such as a metal such as titanium (Ti), copper (Cu), aluminum (Al), or molybdenum (Mo) is stacked on an insulating substrate 110 and patterned to form a first conductive layer including the conductive pattern 111, the lower wire 151a of the first scan line, a plurality of connecting members 70, 71, and 73, and a first pattern 112 positioned to correspond to each of the pixels PX1, PX2, and PX3. The first pattern 112 according to the present embodiment is substantially the same as the first pattern 112 according to the previous embodiment, but may include an opening 12a positioned in a center thereof.

Subsequently, an insulating layer is formed by stacking an inorganic insulating material such as a silicon oxide ($SiO_x$), a silicon oxynitride ($SiO_xN_y$), or a silicon nitride ($SiN_x$) on the first conductive layer. According to an embodiment, the insulating layer on the first conductive layer may be, e.g., the buffer layer 120 described above.

Next, referring to FIG. 17, the insulating pattern 121 overlapping the opening 12a of the first pattern 112 is formed by patterning the buffer layer 120 by etching or the like. In this case, a portion of the buffer layer 120 other than the island-shaped insulating pattern 121 may remain. The insulating pattern 121 may include a first side surface 25b contacting a side surface of the opening 12a of the first pattern 112, a lower surface 23b contacting an upper surface of the first pattern 112, and a second side surface 22b defining an outer edge of the insulating pattern 121. The insulating pattern 121 located in the opening 12a of the first pattern 112 may form a pillar portion 22c, and protruding portions at opposite sides of the pillar portion 22c may form the protrusion 223.

Subsequently, referring to FIG. 18 and FIG. 19, the first pattern 112 is removed through isotropic etching, e.g., wet etching, to form an insulating pattern 121 having an undercut structure. Also herein, a portion overlapping the insulating pattern 121 in the removed first pattern 112 is removed to form an undercut structure of the insulating pattern 121, and thus it may be easy to manage distribution of the undercut structure of the insulating pattern 121 by isotropic etching.

Next, referring to FIG. 20 and FIG. 21, a semiconductor material such as amorphous silicon, polycrystalline silicon, or an oxide semiconductor is stacked and patterned on the substrate 110 on which the insulating layer 121 of an undercut structure is formed, to form a semiconductor layer including a plurality of semiconductor patterns 130a, 130b, and 130c.

Subsequently, a second conductive layer including the upper wire 151b of the first scan line, the second scan line 152, the first capacitor electrode 155, the first gate electrode 154a, the second gate electrode 154b, the third gate electrode 154c, the connection member 70a, and the like is formed by depositing a conductive material such as a metal on the substrate 110 on which the semiconductor layer is formed and patterning the deposited layers by a method such as photolithography. Referring to FIG. 21, the first capacitor electrode 155 may include a bottom portion 1551a, an undercut side portion 1552a, an undercut upper portion 1553a, a side portion 1554a, and an upper portion 1555a formed around the undercut structure of the insulating pattern 121.

The second conductive layer is formed to the inside of the undercut structure of the insulating pattern 121, so the bottom portion 1551a of the first capacitor electrode 155 and the undercut upper portion 1553a formed on the lower surface 23b of the insulating pattern 121 facing the bottom portion 1553 should be spaced apart from each other in the third direction DR3, and accordingly, a method of stacking the second conductive layer that enables such spacing may be used. For example, as the method of stacking the second conductive layer, an atomic layer deposition method may be used.

Next, referring to FIG. 22, an insulating layer is formed by stacking an insulating material on the second conductive layer. The insulating layer formed at this time may be, e.g., the third insulating layer 160 described above. Even in this case, the third insulating layer 160 is formed to the inside of the undercut structure of the insulating pattern 121, so that two insulating layers 160 spaced apart between the bottom portion 1551a of the first capacitor electrode 155 and the undercut upper portion 1553a may be formed facing each other, a stacking method that enables such forming may be used. For example, an atomic layer deposition method may be used as a stacking method of the third insulating layer 160.

Referring to FIG. 14 and FIG. 15 described above, a plurality of openings 20, 21, 23, and 24 are formed in the buffer layer 120 and the third insulating layer 160, and a plurality of openings 60, 61, 62, 63, and 64 are formed in the third insulating layer 160. Subsequently, a conductive material such as a metal is stacked on the third insulating layer 160 and the stacked layer is patterned by a method such as photolithography, to form a third conductive layer including the driving low voltage line 170, a plurality of data lines 171a, 171b, and 171c, the driving voltage line 172, the initialization voltage line 173, the second capacitor electrode 175, the connecting member 174.

Referring to FIG. 15, the second capacitor electrode 175 may include a bottom portion 1751a, a side portion 1752a, and an upper portion 1753a formed around the undercut structure of the third insulating layer 160 and the insulating pattern 121.

Since the third conductive layer must be formed to the inside of the undercut structure of the third insulating layer 160 and the insulating pattern 121, a method of stacking the third conductive layer that enables such formation may be used. For example, an atomic layer deposition method may be used as a stacking method of the third conductive layer.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
a substrate;
a first conductive layer disposed on the substrate;
a first insulating layer positioned on the first conductive layer and having an undercut structure forming an opening;
a first capacitor electrode including a portion formed in the undercut structure;
a second capacitor electrode including a portion formed in the undercut structure and overlapping the first capacitor electrode to form a capacitor; and
a second insulating layer including a portion formed in the undercut structure and positioned between the first capacitor electrode and the second capacitor electrode to function as a dielectric of the capacitor,
wherein the undercut structure includes a first side surface of the first insulating layer forming the opening, a lower surface connected to the first side surface, and a second side surface connected to the lower surface, and
the first capacitor electrode formed in the undercut structure includes:
a first bottom portion parallel to an upper surface of the substrate;
a first undercut side portion connected to the first bottom portion; and
a first undercut upper portion connected to the first undercut side portion.

2. The display device of claim 1, wherein
the second capacitor electrode formed in the undercut structure includes a second bottom portion facing and overlapping the first bottom portion.

3. The display device of claim 2, wherein
the second bottom portion is positioned between the first bottom portion and the first undercut upper portion in a cross-sectional view.

4. The display device of claim 3, wherein
the second bottom portion overlaps a protrusion of the first insulating layer positioned on the lower surface.

5. The display device of claim 4, wherein
the first capacitor electrode further includes:
a first side portion connected to the first undercut upper portion; and
a first upper portion connected to the first side portion and positioned on an upper surface of the first insulating layer.

6. The display device of claim 5, wherein
the second capacitor electrode includes:
a second side portion connected to the second bottom portion and facing the first side portion; and
a second upper portion connected to the second side portion and facing the first upper portion.

7. The display device of claim 6, wherein
the protrusion of the first insulating layer, the first bottom portion, the first undercut upper portion, and the first upper portion of the first capacitor electrode, the second bottom portion, and the second upper portion of the second capacitor electrode overlap each other in a direction that is perpendicular to the upper surface of the substrate.

8. The display device of claim 1, further comprising
a first transistor, a second transistor, and a third transistor positioned on the substrate, wherein the first capacitor electrode is electrically connected to a gate electrode of the first transistor, and
the second capacitor electrode is electrically connected to a first conductive region of the first transistor and a first conductive region of the third transistor.

9. The display device of claim 8, wherein
a second conductive region of the first transistor is configured to receive a driving voltage, and
a second conductive region of the third transistor is configured to receive an initialization voltage.

10. The display device of claim 9, wherein
the first conductive layer includes a conductive pattern overlapping the gate electrode of the first transistor.

11. A display device comprising:
a substrate; and
a capacitor positioned on the substrate,
wherein the capacitor includes:
a first bottom portion of a first conductive layer positioned on the substrate;
a second bottom portion of a second conductive layer positioned on the first bottom portion of the first conductive layer to overlap the first bottom portion; and
an undercut upper portion of the first conductive layer positioned on the second bottom portion of the second conductive layer to overlap the second bottom portion,
wherein a continuous first insulating layer insulating between the first conductive layer and the second conductive layer includes a portion positioned between the first bottom portion of the first conductive layer and the second bottom portion of the second conductive layer, and a portion positioned between the second bottom portion of the second conductive layer and the undercut upper portion of the first conductive layer,
the first bottom portion of the first conductive layer and the undercut upper portion of the first conductive layer are integrally formed as one continuous conductive layer,
the first conductive layer further includes an undercut side portion connecting between the first bottom portion of the first conductive layer and the undercut upper portion of the first conductive layer, and facing a side surface of the second bottom portion of the second conductive layer with the first insulating layer therebetween,
the first conductive layer further includes a first side portion connected to the undercut upper portion of the first conductive layer and not parallel to the upper surface of the substrate, and
the second conductive layer further includes a second side portion connected to the second bottom portion of the second conductive layer and facing the first side portion of the first conductive layer with the first insulating layer therebetween,
the first conductive layer further includes a first upper portion connected to the first side portion of the first conductive layer and parallel to the upper surface of the substrate, and
the second conductive layer further includes a second upper portion connected to the second side portion of the second conductive layer and facing the first upper portion of the first conductive layer with the first insulating layer therebetween.

12. The display device of claim 11, further comprising
a second insulating layer including a protrusion positioned between the first upper portion of the first conductive layer and the undercut upper portion, wherein the undercut upper portion of the first conductive layer and the first upper portion face each other with the second insulating layer therebetween.

13. A manufacturing method of a display device, comprising:

forming a first pattern on a substrate;

forming an opening positioned over the first pattern by stacking a first insulating layer on the first pattern and patterning the first insulating layer;

forming an undercut structure of the first insulating layer by removing the first pattern through the opening;

forming a first capacitor electrode including a portion formed in the undercut structure by stacking a first conductive layer on the substrate on which the first insulating layer is formed and patterning it;

stacking a second insulating layer including a portion formed in the undercut structure on the substrate on which the first capacitor electrode is formed; and forming a second capacitor electrode including a portion formed in the undercut structure by stacking a second conductive layer on the substrate on which the second insulating layer is formed and patterning it.

14. The manufacturing method of claim 13, wherein the removing of the first pattern uses isotropic etching.

15. The manufacturing method of claim 13, wherein the stacking method of at least one of the first conductive layer, the second insulating layer, and the second conductive layer includes an atomic layer deposition method.

\* \* \* \* \*